(12) United States Patent  
Nakamura et al.

(10) Patent No.: US 8,502,756 B2  
(45) Date of Patent: Aug. 6, 2013

(54) IMAGE DISPLAY DEVICE WITH IMAGING UNIT

(75) Inventors: Kazuo Nakamura, Kanagawa (JP); Katsuhide Uchino, Kanagawa (JP); Jiro Yamada, Kanagawa (JP); Ken Tamayama, Tokyo (JP); Hiroshi Sagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 380 days.

(21) Appl. No.: 12/923,877

(22) Filed: Oct. 13, 2010

(65) Prior Publication Data

US 2011/0102308 A1 May 5, 2011

(30) Foreign Application Priority Data

Nov. 2, 2009 (JP) .................... 2009-251729  
Mar. 3, 2010 (JP) .................... 2010-047157  
Mar. 3, 2010 (JP) .................... 2010-047158

(51) Int. Cl.  
*G09G 3/32* (2006.01)  
*G09G 5/00* (2006.01)

(52) U.S. Cl.  
USPC ............................ 345/82; 345/207; 348/14.01

(58) Field of Classification Search  
USPC .................... 345/82, 207; 348/14.01  
See application file for complete search history.

(56) References Cited

U.S. PATENT DOCUMENTS

| | | | |
|---|---|---|---|
| 8,022,977 B2 * | 9/2011 | Kanade et al. | 348/14.07 |
| 2004/0257473 A1 * | 12/2004 | Miyagawa | 348/571 |
| 2004/0263670 A1 * | 12/2004 | Yamasaki | 348/340 |
| 2005/0128332 A1 | 6/2005 | Tsuboi | |
| 2008/0165267 A1 * | 7/2008 | Cok | 348/333.01 |
| 2008/0186289 A1 | 8/2008 | Ijima et al. | |

FOREIGN PATENT DOCUMENTS

| | | |
|---|---|---|
| JP | 2005-010407 | 1/2005 |
| JP | 2005-017813 | 1/2005 |
| JP | 2005-176151 | 6/2005 |
| JP | 2007-163816 | 6/2007 |
| JP | 2008-191261 | 8/2008 |
| JP | 2008-191465 | 8/2008 |

* cited by examiner

*Primary Examiner* — Kevin M Nguyen  
(74) *Attorney, Agent, or Firm* — Rader, Fishman & Grauer PLLC

(57) ABSTRACT

An image display unit comprises a display area including pixels, and an imaging unit disposed at its rear side behind the display area. Light transmissive sections are located within the display area and correspond to the pixels. The light transmissive sections are configured to separately receive light incident upon the image display unit, and pass the received light to the imaging unit.

33 Claims, 13 Drawing Sheets

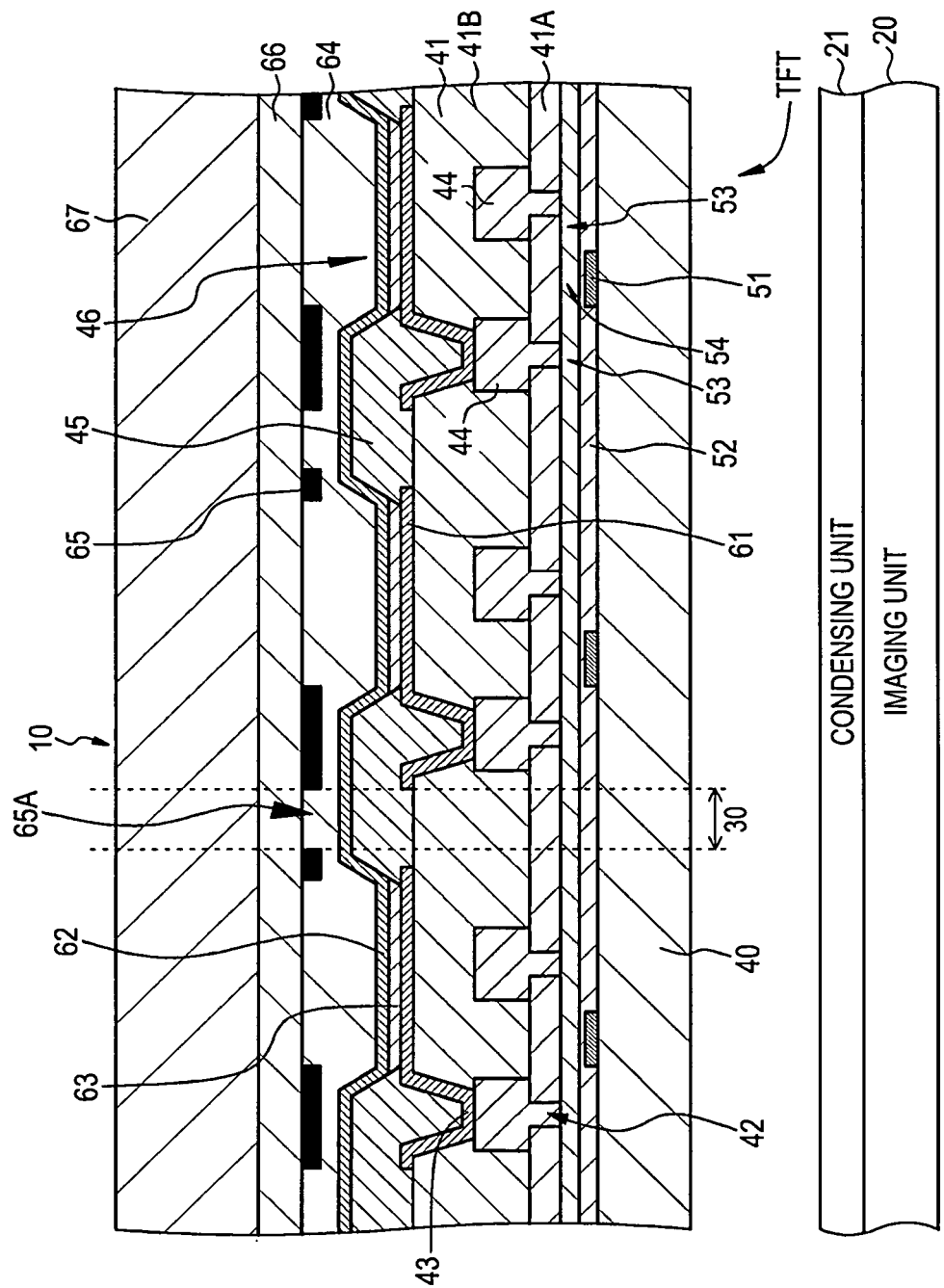

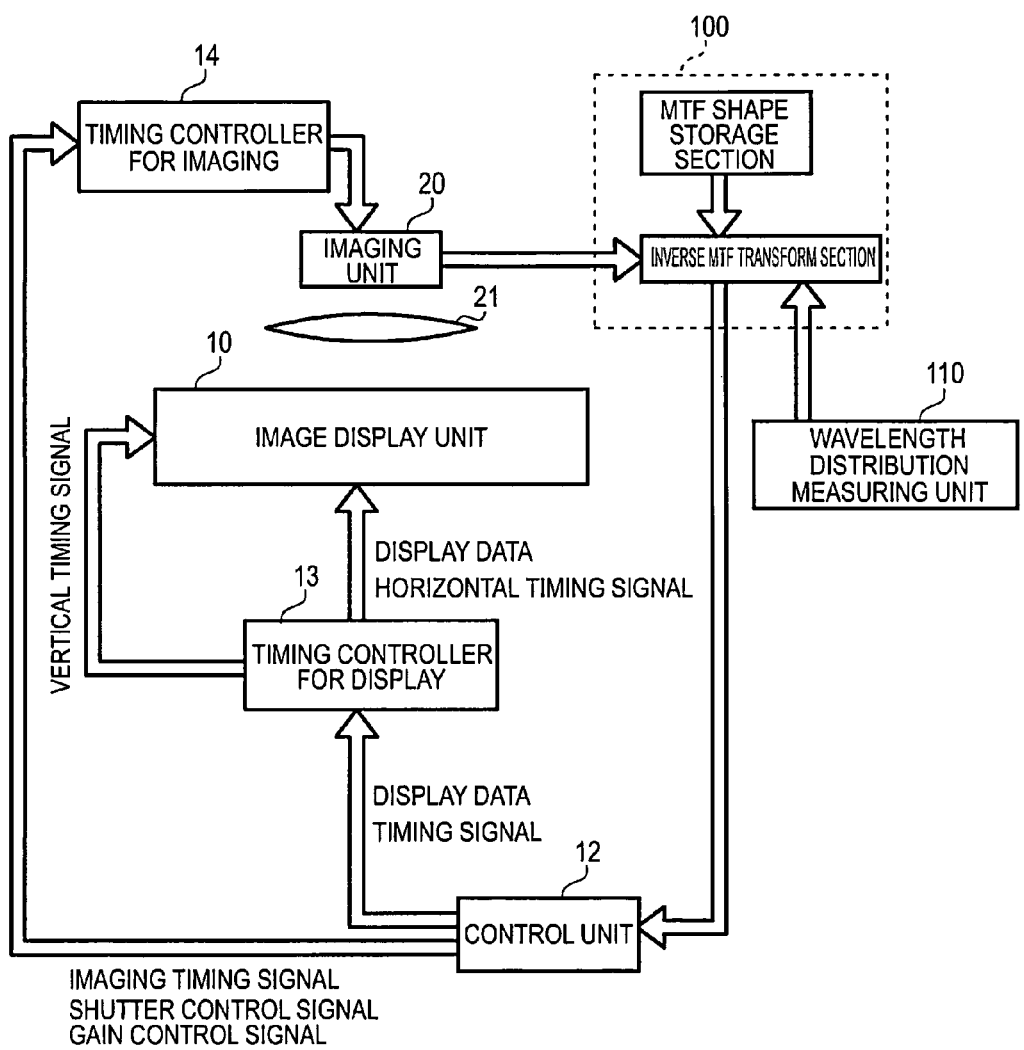

KEYBOARD
MAIN BODY

IMAGE DISPLAY DEVICE WITH IMAGING UNIT

BACKGROUND OF THE INVENTION

1. Field of the Invention

The present invention relates to an image display device with an imaging unit, and more specifically, an image display device in which an imaging unit is disposed at the rear side of an image display unit.

2. Description of the Related Art

In recent years, there has been a growing interest in organic electroluminescent display devices (hereinafter, simply referred to as an "organic EL display device") as a flat panel display device (FP display device). Currently, a liquid crystal display (LCD) is the mainstream of FP display devices. However, since the LCD is not a self-emission device, components, such as a backlight and a polarizer, are necessary. Accordingly, there is a problem in that the thickness of the FP display device increases and the brightness is not sufficient. On the other hand, the organic EL display device is a self-emission device. Accordingly, components, such as a backlight, are not necessary in principle. For this reason, the organic EL display device has many advantages over the LCD due to its slimness, high brightness, and the like. Particularly in an active matrix type organic EL display device in which a switching element is disposed in each pixel, a low current consumption can be suppressed by hold lighting of each pixel, and big-sized screens and high definition can be realized relatively easily. For this reason, such an active matrix type organic EL display device is under development in many companies, and is expected to become the mainstream of a next-generation FP display device.

Moreover, in recent years, a video conference system (TV phone system) which allows persons located in remote locations to talk to each other while watching their faces by connecting at least two sets of image display devices and imaging devices to each other through a communication line or a network has started to spread. The TV phone function can be easily realized by using a low-cost imaging device called a web camera, a personal computer, and software. In such a TV phone system, however, users talk with each other by imaging a face of the user located at one side with an imaging device, displaying the obtained image on an image display device at the other side, imaging a face of the user located at the other side with an imaging device, and displaying the obtained image on an image display device at one side. Moreover, since each user talks to the other party while watching the face of the other party displayed on his or her own image display device, his or her eyes or face faces his or her own image display device. In a known TV phone system, an imaging device is placed out of a display region of an image display device. Accordingly, user's eyes do not face the imaging device. For this reason, a user's face at one side projected on the image display device does not face a user located at the other side, which may result in a sense of discomfort. This sense of discomfort occurring due to not facing the other party is one of the causes of delaying the spread of TV phones.

Attempts to add functions other than image display to an image display device have also been made actively. For example, JP-A-2005-176151 or JP-A-2005-010407 discloses an FP display device with an imaging unit.

SUMMARY OF THE INVENTION

The present invention can be embodied in various forms, including image display units, electronic apparatus, image processing units, image processing methods, integrated circuits, and the like.

In one embodiment, an image display unit comprises a display area including pixels, and an imaging unit disposed at its rear side behind the display area. Light transmissive sections are located within the display area and correspond to the pixels. The light transmissive sections are configured to separately receive light incident upon the image display unit, and pass the received light to the imaging unit.

BRIEF DESCRIPTION OF THE DRAWINGS

FIG. 2 is a sectional view schematically showing a part of the image display device with an imaging unit;

FIG. 9 is a block diagram showing another example of an image display device with an imaging unit;

DESCRIPTION OF THE PREFERRED EMBODIMENTS

Figure 1A:
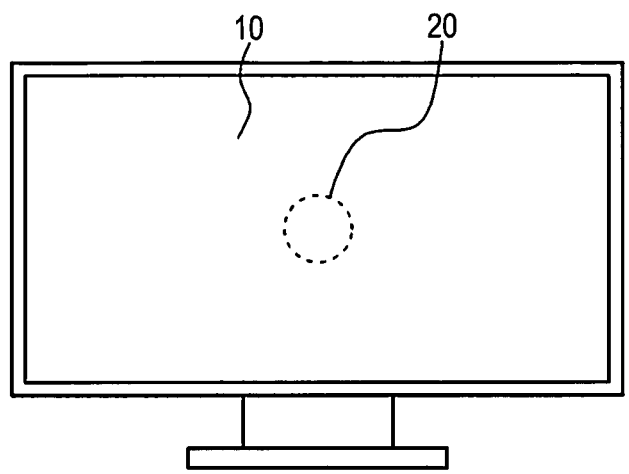
FIGS. 1A and 1B are schematic views when an image display device with an imaging unit viewed from the front and side surfaces, respectively.

In the technique disclosed in JP-A-2005-176151, a plurality of openings with minute lenses are provided between pixels, which form an image display unit of an image display device, and imaging using the light beams transmitted through a plurality of openings is performed by a plurality of cameras. Here, a face of a user who is watching the image display device is imaged from a plurality of different angles, and then the plurality of images obtained are processed to generate an image when viewing the user from the front side.

In the technique disclosed in JP-A-2005-176151, however, it is necessary to provide a minute lens in the opening, and a highly precise and minute lens is necessary in order to form an image on the imaging unit correctly. This increases manufacturing costs of the image display device. Moreover, since a front image is created from a plurality of images, which are imaged from different angles, instead of imaging a front face of the user, a so-called CG image is presented to the other party instead of a photographed image. This causes a considerable sense of discomfort in practice.

In the technique disclosed in JP-A-2005-010407, for example, as shown in FIGS. 15 and 16 thereof, an imaging unit performs imaging on the basis of the light transmitted through one light transmissive section provided in a plurality of pixels. For this reason, it is difficult to condense a sufficient amount of light to the imaging unit.

Therefore, it is desirable to provide an image display device with an imaging unit which can be manufactured at a low cost, which can make a sufficient amount of light condensed to the imaging device, and which can easily acquire a user's image facing an image display unit.

One, example of an image display unit comprises a display area including pixels, and an imaging unit disposed at its rear side behind the display area. Light transmissive sections are located within the display area and correspond to the pixels. The light transmissive sections are configured to separately receive light incident upon the image display unit, and pass the received light to the imaging unit.

In the image display device with an imaging unit according to at least one embodiment of the present invention, the light transmitted through the light transmissive section (plurality of light transmissive sections) provided in each of the plurality of pixels is condensed to the imaging unit, or the light transmitted through the light transmissive section provided around at least one or more pixels is condensed to the imaging unit. Accordingly, a highly precise and minute lens is not necessary in order to form an image on the imaging unit correctly. As a result, a sufficient amount of light can be condensed to the imaging unit without increasing the manufacturing costs of the image display device with an imaging unit. In addition, since the imaging unit is disposed at the rear side of the image display unit, a face, eye, movement, and the like of a user facing the image display unit can be correctly imaged by the imaging unit.

Hereinafter, embodiments of the present invention will be described through examples with reference to the accompanying drawings. However, the present invention is not limited to these examples, and various numeric values and materials in the examples are only illustrative.

In an image display device with an imaging unit according to at least one embodiment of the present invention, a diffraction phenomenon occurs in the light transmissive section when the light transmissive section is minute. As a result, a blur may be generated on an image which is formed in the imaging unit or the image may not be clear. In such a case, it is preferable to further include a diffraction correcting unit that corrects diffraction, which occurs in the light transmissive section, with respect to the image information acquired through the imaging unit. Moreover, such a configuration is called a "first configuration of the present invention" for the sake of convenience.

Moreover, in the first configuration of the present invention, it is preferable that some or all of the light transmissive sections are provided periodically along first and second directions of the image display unit. In addition, assuming that the length of the light transmissive section in the first direction is $L_{tr-1}$ and the pitch between the pixels in the first direction is $P_{px-1}$, it is preferable that the line aperture ratio $L_{tr-1}/P_{px-1}$ in the first direction satisfies $L_{tr-1}/P_{px-1} \geq 0.5$, more preferably, $L_{tr-1}/P_{px-1} \geq 0.8$. In addition, assuming that the length of the light transmissive section in the second direction is $L_{tr-2}$ and the pitch between the pixels in the second direction is $P_{px-2}$, it is preferable that the line aperture ratio $L_{tr-2}/P_{px-2}$ in the second direction satisfies $L_{tr-2}/P_{px-2} \geq 0.5$, more preferably, $L_{tr-2}/P_{px-2} \geq 0.8$. The first and second directions may be perpendicular to each other or may cross each other at an angle other than 90° depending on the situation. In the latter case, some or all of the light transmissive section may be periodically provided not only in the first and second directions of the image display unit but also in a third, fourth, . . . directions. In this case, it is preferable that the length of the light transmissive section in at least two directions among the directions and the pitch between pixels in at least two directions of them satisfy the above-described relationship (specifically, 0.5 times or more). The upper limits of the line aperture ratios $L_{tr-1}/P_{px-1}$ and $L_{tr-2}/P_{px-2}$ are not particularly limited as long as a light transmissive section can be formed. Here, the length $L_{tr-1}$ of the light transmissive section in the first direction means a length per period of a line segment corresponding to the shape when projecting the light transmissive section in the first direction, and the pitch $P_{px-1}$ between pixels in the first direction means a length per period of a pixel in the first direction. Similarly, the length $L_{tr-2}$ of the light transmissive section in the second direction means a length per period of a line segment corresponding to the shape when projecting the light transmissive section in the second direction, and the pitch $P_{px-2}$ between pixels in the second direction means a length per period of a pixel in the second direction.

Specifically, in the first configuration of the present invention, it is preferable to perform inverse MTF (Modulation Transfer Function) transform, which is a calculation processing based on the shape, size, and distribution of the light transmissive sections (depending on the situation, also based on the wavelength of outside light), on the image information. The shape, size, and the distribution of the light transmissive sections are preferably stored beforehand in the diffraction correcting unit. The diffraction correcting unit may be formed as a circuit including a CPU with input and output sections and a memory, for example. Depending on the situation, the diffraction correcting unit may be formed using a personal computer included in the image display device with an imaging unit. By taking the wavelength of outside light into consideration, an optimal image can be obtained without dependence on the outside light (outside lighting environment).

The image display device with an imaging unit of the present invention, which includes the preferable configuration described above, may further include a wavelength distribution measuring unit that measures the wavelength distribution of the outside light. Moreover, such a configuration is called a "second configuration of the present invention" for the sake of convenience. By adopting such a configuration, it is possible to improve the precision of the image information acquired through the imaging unit (for example, it is possible to improve the precision of color information) and also to improve the precision of inverse MTF transform. For example, the wavelength distribution measuring unit may be formed using a light receiving device, such as a photosensor. It is preferable to control the wavelength distribution measuring unit by the image display device with an imaging unit. Depending on the situation, the wavelength distribution measuring unit may be controlled by a personal computer provided in the image display device with an imaging unit.

Moreover, the image display device with an imaging unit of the present invention, which includes the first configuration of the present invention, the second configuration of the present invention, and the above preferable configuration, may further include: an information transmitting unit that transmits image information acquired through the imaging unit; and a display unit that displays an image, which is based on the image information input from the outside, on the image display unit. The image information acquired through the imaging unit may be transmitted to the outside by the information transmitting unit, and an image based on the image information input from the outside may be displayed on the image display unit by the display unit. Moreover, such a configuration is called a "third configuration of the present invention" for the sake of convenience. A so-called video conference system (TV phone system) may be built by connecting a plurality of (two or more) such image display devices with imaging units through a communication line, a network, or the like.

For example, an existing means used in a video conference system (TV phone system) is preferably used as the information transmitting unit that transmits the image information acquired through the imaging unit and the display unit that displays an image based on the image information input from the outside on the image display unit. It is preferable to provide a switch, a button, or a keyboard for operation in the image display device with an imaging unit (or the image display unit). Depending on the situation, the information transmitting unit and the display unit may be formed using a personal computer provided in the image display device with an imaging unit. In this case, it is preferable to connect the personal computer to a communication line, a network, or the like.

Alternatively, the image display device with an imaging unit of the present invention, which includes the first configuration of the present invention, the second configuration of the present invention, and the above preferable configuration, may further include: a storage unit that stores the image information acquired through the imaging unit; and a display unit that displays images, which are based on the image information acquired through the imaging unit and the image information stored in the storage unit, on the image display unit. The display unit may display on the image display unit the image based on the image information acquired through the imaging unit and also displays on the image display unit the image based on the image information stored in the storage unit. Moreover, such a configuration is called a "fourth configuration of the present invention" for the sake of convenience. Such an image display device with an imaging unit functions as a so-called digital mirror. For example, a video image or an image of a user imaged in the past may be compared with a current video image or a current image of the user (two or more video images or two or more images with a time difference at the time of imaging may be compared with each other).

Here, the storage unit that stores the image information acquired through the imaging unit may be formed by a known nonvolatile memory or hard disk drive and a known image information processing circuit, for example. In addition, the display unit that displays an image on the image display unit may be formed by a known image information display circuit, for example. It is preferable to provide a switch, a button, or a keyboard for operation in the image display device with an imaging unit (or the image display unit). Depending on the situation, the storage unit and the display unit may also be formed using a personal computer provided in the image display device with an imaging unit.

In the image display device with an imaging unit according to the first embodiment of the present invention, which includes the first configuration of the present invention, the second configuration of the present invention, and the above preferable configuration, the sizes of the plurality of light transmissive sections may be set randomly (specifically, at least two light transmissive sections adjacent to one light transmissive section are different in size from the one light transmissive section) [Case A]. Alternatively, the shapes of the plurality of light transmissive sections may be set randomly (specifically, at least two light transmissive sections adjacent to one light transmissive section are different in shape from the one light transmissive section) [Case B]. Alternatively, the arrangement pitch of the plurality of light transmissive sections may be set randomly (specifically, the arrangement pitches between one light transmissive section and at least two light transmissive sections adjacent to the one light transmissive section are set differently) [Case C].

Here, [Case A], [Case B], or [Case C] may be independently adopted. In addition, a combination of [Case A] and [Case B], a combination of [Case A] and [Case C], or a combination of [Case B] and [Case C] may be adopted, or a combination of [Case A], [Case B], and [Case C] may be adopted. The minimum value of the size or the minimum shape of the light transmissive section depends on the minimum processing dimension (for example, 0.5 µm) in a photolithographic technique or an etching technique for providing the light transmissive section.

In addition, the sizes of the plurality of light transmissive sections are set randomly. Specifically, it is desirable to set differently the sizes of at least two light transmissive sections (for the sake of convenience, called "light transmissive sections B and C") adjacent to one light transmissive section (for the sake of convenience, called a "light transmissive section A"), preferably, the sizes of two light transmissive sections disposed in the horizontal direction, more preferably, the sizes of three light transmissive sections (for the sake of convenience, called "light transmissive sections B, C, and D") adjacent to the light transmissive section A, even more preferably, the sizes of four light transmissive sections (for the sake of convenience, called "light transmissive sections B, C, D, and E") adjacent to the light transmissive section A. That is, it is desirable to set the sizes of the light transmissive sections A and B differently, to set the sizes of the light transmissive sections A and C differently, to set the sizes of the light transmissive sections A and D differently, and to set the sizes of the light transmissive sections A and E differently. Similarly, the shapes of the plurality of light transmissive sections are set randomly. Specifically, it is desirable to set differently the shapes of at least two light transmissive sections (light transmissive sections B and C) adjacent to one light transmissive section (light transmissive section A), preferably, the shapes of two light transmissive sections disposed in the horizontal direction, more preferably, the shapes of three light transmissive sections (light transmissive sections B, C, and D) adjacent to the light transmissive section A, even more preferably, the shapes of four light transmissive sections (light transmissive sections B, C, D, and E) adjacent to the light transmissive section A. That is, it is desirable to set the shapes of the light transmissive sections A and B differently, to set the shapes of the light transmissive sections A and C differently, to set the shapes of the light transmissive sections A and D differently, and to set the shapes of the light transmissive sections A and E differently. Similarly, the arrangement pitches of the plurality of light transmissive sections are set randomly. Specifically, it is desirable to set differently the arrangement pitches between one light transmissive section (light transmissive section A) and at least two light transmissive sections (light transmissive sections B and C) adjacent to the one light transmissive section, preferably, the arrangement pitches between the light transmissive section A and two light transmissive sections disposed in the horizontal direction, more preferably, the arrangement pitches between the light transmissive section A and three light transmissive sections (light transmissive sections B, C, and D) adjacent to the light transmissive section A, even more preferably, the arrangement pitches between the light transmissive section A and four light transmissive sections (light transmissive sections B, C, D, and E) adjacent to the light transmissive section A. That is, it is desirable to set differently the arrangement pitch between the light transmissive sections A and B, the arrangement pitch between the light transmissive sections A and C, the arrangement pitch between the light transmissive sections A and D, and the arrangement pitch between the light transmissive sections A and E.

Moreover, in the image display device with an imaging unit according to the first embodiment of the present invention, which includes the first configuration of the present invention, the second configuration of the present invention, and the above preferable configuration, the light transmissive section may be made to have a hollow structure or a double ring structure (double hollow structure). Specifically, the light transmissive section may be formed by a single light transmissive section, or the light transmissive section may be formed by first and second light transmissive sections and the second light transmissive section may be disposed so as to surround the first light transmissive section. It was possible to suppress the occurrence of a diffraction phenomenon reliably by optimizing the sizes, shapes, and arrangement state of the light transmissive section and the first and second light transmissive sections, the positional relationship of the light transmissive section, and the positional relationship of the first and second light transmissive sections. In addition, it may be combined with [Case A], [Case B], or [Case C], may be combined with [Case A] and [Case B], [Case A] and [Case C], or [Case B] and [Case C], or may be combined with [Case A], [Case B], and [Case C].

In the image display device with an imaging unit of the present invention including various preferable forms and configurations described above, the light emitting device is preferably a self-emission type light emitting device. More preferably, the light emitting device is an organic electroluminescent device (organic EL device). In addition, a liquid crystal display device which forms the liquid crystal display device controls the passage of light from the outside (light from a backlight or outside light), and a pixel does not include a light emitting device. When a light emitting device is formed by an organic EL device, an organic layer (light emitting section) which forms the organic EL device has a light emitting layer made of an organic light emitting material. Specifically, it may have a laminated structure of a hole transport layer, a light emitting layer, and an electron transport layer, a laminated structure of a hole transport layer and a light emitting layer which also serves as an electron transport layer, or a laminated structure of a hole injection layer, a hole transport layer, a light emitting layer, an electron transport layer, and an electron injection layer, for example. Moreover, when the electron transport layer, the light emitting layer, the hole transport layer, and the hole injection layer are formed as a "tandem unit", the organic layer may have a double tandem structure in which a first tandem unit, a connection layer, and a second tandem unit are laminated, or may have a triple tandem structure in which three or more tandem units are laminated. In these cases, the organic layer which emits white light as a whole can be obtained by changing the emission color using red, green, blue, and each tandem unit.

By optimizing the thickness of the organic layer, for example, by making the light beams emitted from the light emitting layer resonate between the first and second electrodes, some of the light beams can be emitted to the outside through the second electrode.

Moreover, in the image display device with an imaging unit of the present invention including various preferable forms and configurations described above, the image display unit may include: a first substrate; a driving circuit provided on the first substrate; an interlayer insulating layer which covers the driving circuit; a light emitting section provided on the interlayer insulating layer; a protective layer provided on the light emitting section; a light shielding layer provided on the protective layer; and a second substrate which covers the protective layer and the light shielding layer. Each pixel may include the driving circuit and the light emitting section, and an opening may be provided in the light shielding layer. The light transmissive section may be formed by the opening and a part of the protective layer and a part of the interlayer insulating layer, which are located below the opening. The condensing unit and the imaging unit may be disposed at a surface side of the first substrate not facing the second substrate.

Here, examples of the pixel arrangement include striped arrangement, diagonal arrangement, delta arrangement, and rectangle arrangement. Moreover, examples of the first or second substrate include a high-distortion-point glass substrate, a soda glass ($Na_2O \cdot CaO \cdot SiO_2$) substrate, a borosilicate glass ($Na_2O \cdot B_2O_3 \cdot SiO_2$) substrate, a forsterite ($2MgO \cdot SiO_2$) substrate, a lead glass ($Na_2O \cdot PbO \cdot SiO_2$) substrate, various glass substrates each having an insulating film formed on its surface, a quartz substrate, a quartz substrate having an insulating film formed on its surface, a silicon substrate having an insulating film formed on its surface, and an organic polymer (having a form of a polymeric material called a plastic film, a plastic sheet, or a plastic substrate which is made of a polymeric material and is flexible) illustrated in polymethylmethacrylate (polymethyl methacrylate, PMMA), polyvinyl alcohol (PVA), polyvinyl phenol (PVP), polyether sulfone (PES), polyimide, polycarbonate, and polyethylene terephthalate (PET). The driving circuit is preferably formed by one or a plurality of thin film transistors (TFTs), for example. As a material of the interlayer insulating layer, $SiO_2$ based materials, such as $SiO_2$, BPSG, PSG, BSG, AsSG, PbSG, SiON, SOG (spin on glass), low-melting-point glass, and glass paste; SiN based materials; and insulating resins, such as polyimide, may be used individually or may be appropriately used in combination. When a pixel is formed using an organic EL device, the light emitting section is as described above. As a constituent material of the protective film, it is preferable to use a material which is transparent for the light emitted from the light emitting section and which is dense so that moisture does not permeate thereinto. Specifically, for example, amorphous silicon ($\alpha$-Si), amorphous silicon carbide ($\alpha$-SiC), amorphous silicon nitride ($\alpha$-$Si_{1-x}N_x$), amorphous silicon oxide ($\alpha$-$Si_{1-y}O_y$), amorphous carbon ($\alpha$-C), amorphous silicon oxynitride ($\alpha$-SiON), and $Al_2O_3$ may be mentioned. The light shielding layer (black matrix) may be formed of a known material. A color filter may be provided when necessary.

In the image display device with an imaging unit of the present invention, which includes various kinds of preferable configurations and forms described above (hereinafter, may be collectively called as "present invention"), the image display unit is formed by arraying a plurality of pixel units including light emitting devices. In this case, if the number of pixel units is expressed as (M, N), it is possible to exemplify some resolution for image display including not only VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536) but also (1920, 1035), (720, 480), (854, 480), and (1280, 960). However, the resolution is not limited to these values. In the image display unit that performs color display, one pixel unit may be configured to include three kinds of pixels, that is, a red light emitting pixel which emits red light, a green light emitting pixel which emits green light, and a blue light emitting pixel which emits blue light, for example. Alternatively, one pixel unit may be configured to include four or more kinds of pixels. Specifically, one pixel unit may include not only the three kinds of pixels but also a pixel which emits white light in order to improve the brightness, a pixel which emits light with a complementary color in order to expand the color reproduction range, a pixel which emits yellow light in order to expand the color reproduction range, a pixel which emits yellow and cyan light in order to expand the color reproduction range, and the like.

In the image display device with an imaging unit according to the first embodiment of the present invention, the light transmissive section is provided in each of the plurality of pixels. Specifically, it is preferable that the light transmissive section is provided in three or more pixels, for example, although not limited thereto. The outer shape of the light transmissive section is basically arbitrary, and a quadrangle, such as a rectangle or a square, may be mentioned. Moreover, in the image display device with an imaging unit according to the second embodiment of the present invention, the light transmissive section is provided around at least one or more pixels. Specifically, it is preferable that the light transmissive section is provided around three or more pixels, for example, although not limited thereto. The outer shape of the light transmissive section is basically arbitrary. An "L" shape (form in which a light transmissive section is provided at two continuous sides among the sides equivalent to the boundary of a pixel), a square bracket shape (form in which a light transmissive section is provided at three continuous sides among the sides equivalent to the boundary of a pixel), a rectangular shape (form in which a light transmissive section is provided at all sides equivalent to the boundary of a pixel), and a hanging rack shape (form in which a light transmissive section is provided at all sides equivalent to the boundary of a pixel and is provided in common between adjacent pixels) may be exemplified. Moreover, preferably, the light transmissive section is provided in a pixel group in which a projected image of a lens provided in the imaging unit is included, and is provided around the pixel group.

In the present invention, the imaging unit is preferably disposed at the rear side of the image display unit, and it is also preferable to dispose it in the middle of the image display unit. One or a plurality of imaging units may be provided. For example, a known solid-state imaging device including a CCD device or a CMOS sensor, which is commercially available, may be used as an imaging unit. In addition, a solid state imaging device, such as a video camera or a web camera commercially available, may also be used. In these cases, the condensing unit and the imaging unit are integrally formed.

As the condensing unit that condenses the light beams transmitted through the plurality of light transmissive sections to the imaging unit, a known lens may be mentioned. Specifically, a biconvex lens, a plano-convex lens, or a meniscus convex lens may be used as a lens. Alternatively, the condensing unit may be formed by a reflecting mirror or a Fresnel lens, may be formed by combination of these various kinds of convex lenses, or may be formed by combination of a concave lens and these various kinds of convex lenses.

In the present invention, it is preferable that neither a color filter nor an image forming system, such as a microlens, is disposed on the optical path of light which is incident on the image display unit, transmitted through the light transmissive section, emitted from the image display unit, and incident on the condensing unit.

The present invention may be used as an alternative of a monitor device which forms a personal computer, as an alternative of a monitor device built in a notebook type personal computer, as an alternative of a monitor device built in a mobile phone, a PDA (Personal Digital Assistant), or a game machine, or as an alternative of a known television receiver.

Figure 1B:
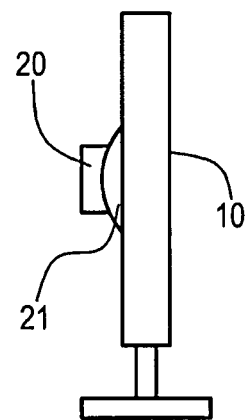
Figure 1C:
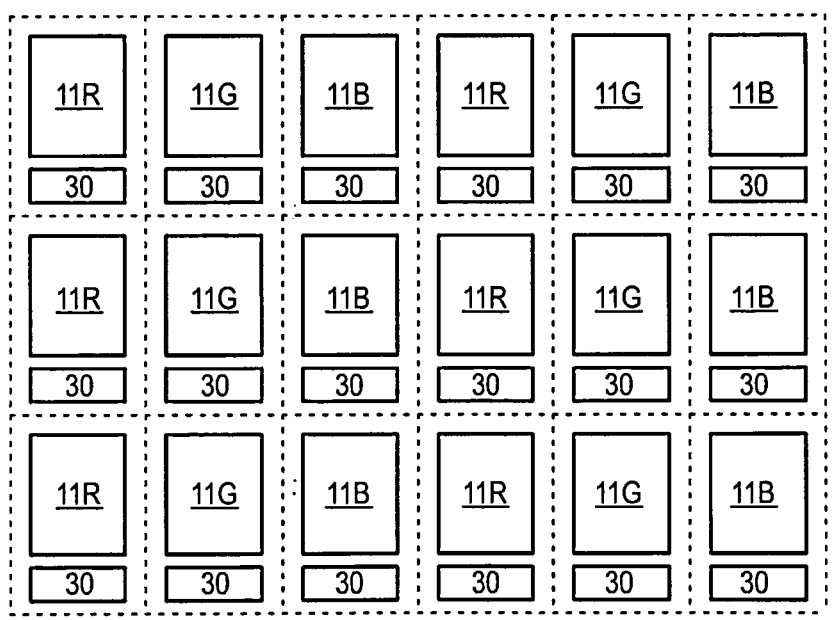
FIG. 1C is a schematic view showing the arrangement of a plurality of pixels which form an image display unit.

A first example is related to the image display device with an imaging unit according to the first embodiment of the present invention. FIGS. 1A and 1B are conceptual views when an image display device with an imaging unit in the first example is viewed from the front and side surfaces, respectively. FIG. 1C is a schematic view showing the arrangement of a plurality of pixels which form an image display unit. FIG. 2 is a sectional view schematically showing a part of the image display device with an imaging unit.

The image display device with an imaging unit in the first example includes: an image display unit 10 in which a plurality of pixels 11 (11R, 11G, 11B) including light emitting devices are arrayed; a light transmissive section 30 provided in each of the plurality of pixels 11; an imaging unit 20 disposed at the rear side of the image display unit 10; and a condensing unit 21 that condenses the light beams transmitted through the plurality of light transmissive sections 30 to the imaging unit 20.

In the first example or second to eighth examples to be described later, the light emitting device is a self-emission type light emitting device. Specifically, the light emitting device is an organic EL device, and the image display unit 10 is a color display XGA type organic EL display device. That is, if the number of pixel units is expressed as (M, N), (M, N) is (1024, 768). In addition, one pixel unit is configured to include three pixels, that is, a red light emitting pixel 11R which emits red light, a green light emitting pixel 11G which emits green light, and a blue light emitting pixel 11B which emits blue light. In FIGS. 1C, 7A and 7B, 8, 10A and 10B, 11, 12A and 12B, and 13A and 13B, the outer edge of a pixel is shown by a dotted line. The imaging unit 20 is disposed at the rear side of the image display unit 10. More specifically, one imaging unit 20 is disposed in a middle portion at the rear side of the image display unit 10. Here, the imaging unit 20 and the condensing unit 21 are formed by a known and commercially available video camera with a CCD device in which they are integrally formed. The image display device with an imaging unit in the first example is used as an alternative of a monitor device included in a personal computer. Moreover, the image display device with an imaging unit in the first example includes a personal computer.

The light transmissive sections 30 are provided in the eighteen (6×3=18) pixels 11, although the number of light transmissive sections is not limited. One light transmissive section 30 is provided in one pixel. The condensing unit 21 condenses the light beams, which are transmitted through the light transmissive sections 30 in the eighteen (6×3=18) pixels 11, to the imaging unit 20. The shape of each light transmissive section 30 is a rectangle.

In the first example or second to eighth examples to be described later, a scanning signal supply IC for driving each scanning line and an image signal supply IC for supplying an image signal are disposed in the image display unit 10. Moreover, a scanning line control circuit is connected to the scanning signal supply IC, and a signal line control circuit is connected to the image signal supply IC. On the optical path of light which is incident on the image display unit 10, transmitted through the light transmissive section 30, emitted from the image display unit 10, and incident on the condensing unit 21, neither a color filter nor an image forming system, such as a microlens, is disposed.

In the first example or second to eighth examples to be described later, specifically, the image display unit 10 includes: a first substrate 40; a driving circuit provided on the first substrate 40; an interlayer insulating layer 41 which covers the driving circuit; a light emitting section (organic layer 63) provided on the interlayer insulating layer 41; a protective layer 64 provided on the light emitting section (organic layer 63); a light shielding layer 65 provided on the protective layer 64; and a second substrate 67 which covers the protective layer 64 and the light shielding layer 65.

Each pixel 11 includes the driving circuit and the light emitting section, and an opening 65A is provided in the light shielding layer 65. The light transmissive section 30 is formed by the opening 65A and a part of the protective layer 64, a part of a second electrode 62, a part of the interlayer insulating layer 41, and the like located below the opening 65A. The condensing unit 21 and the imaging unit 20 are disposed at the surface side of the first substrate 40 not facing the second substrate 67.

More specifically, a driving circuit is provided on the first substrate 40 formed of soda glass. The driving circuit is formed by a plurality of TFTs. A TFT has: a gate electrode 51 formed on the first substrate 40; a gate insulating layer 52 formed on the first substrate 40 and the gate electrode 51; a source/drain region 53 provided in a semiconductor layer formed on the gate insulating layer 52; and a channel forming region 54 which is located between the source/drain region 53 and to which a part of the semiconductor layer located above the gate electrode 51 corresponds. In the example shown in the drawing, the TFT is of a bottom gated mode. However, the TFT may be of a top gate type. The gate electrode 51 of the TFT is connected to a scanning line (not shown). Moreover, the interlayer insulating layer 41 (41A, 41B) covers the first substrate 40 and the driving circuit. Moreover, a first electrode 61 which forms an organic EL device is provided on the interlayer insulating layer 41B made of $SiO_X$, $SiN_Y$, polyimide resin, or the like. The TFT and the first electrode 61 are electrically connected to each other through a contact plug 42 provided in the interlayer insulating layer 41A, a wiring line 43, and a contact plug 44. In the drawing, one TFT is shown in one organic EL device driving unit.

An opening 46 is provided on the interlayer insulating layer 41, and an insulating layer 45 from which the first electrode 61 is exposed is formed in a bottom portion of the opening 46. The insulating layer 45 is formed of an insulating material which is excellent in flatness and which has a low water absorption rate in order to maintain the brightness of emitted light by preventing deterioration of the organic layer 63 caused by moisture. Specifically, the insulating layer 45 is formed of polyimide resin. The organic layer 63 having a light emitting layer made of an organic light emitting material is provided to extend from the above of a portion of the first electrode 61, which is exposed to a bottom portion of the opening 46, to a portion of the insulating layer 45 which surrounds the opening 46. Although the organic layer 63 has a laminated structure of a hole transport layer and a light emitting layer which also serves as an electron transport layer, for example, the organic layer 63 has one layer in the drawing.

On the second electrode 62, the protective layer 64 with an insulation property, which is made of amorphous silicon nitride ($\alpha\text{-}Si_{1-x}N_x$) is provided using a plasma CVD method in order to prevent the moisture from reaching the organic layer 63. The light shielding layer 65 made of black polyimide resin is formed on the protective layer 64, and the second substrate 67 made of soda glass is disposed on the protective layer 64 and the light shielding layer 65. The protective layer 64 and the light shielding layer 65 are bonded to the second substrate 67 with an adhesive layer 66 made of acrylic based adhesive. The first electrode 61 is used as an anode, and the second electrode 62 is used as a cathode. Specifically, the first electrode 61 is formed of a light reflective material, such as aluminum (Al), silver (Ag), or an alloy thereof, with a thickness of 0.2 to 0.5 μm. The second electrode 62 is formed of a transparent conductive material, such as ITO or IZO, with a thickness of 0.1 μm or a metal thin film (translucent metal thin film) which allows light to be transmitted therethrough to some extent, such as silver (Ag) or magnesium (Mg), with a thickness of 5 nm. The second electrode 62 is not patterned but is formed in one sheet. Depending on a situation, an electron injection layer (not shown) made of LiF with a thickness of 0.3 nm may be formed between the organic layer 63 and the second electrode 62.

To sum up, the detailed configuration of the light emitting device in the first example or the second to eighth examples to be described later is expressed in the following table 1.

TABLE 1

| | |
|---|---|
| Second substrate 67 | soda glass |
| Adhesive layer 66 | acrylic based adhesive |
| Light shielding layer 65 | black polyimide resin |
| Protective layer 64 | $SiN_x$ layer (thickness: 5 μm) |
| Second electrode (cathode) 62 | ITO layer (thickness: 0.1 μm) or translucent metal thin film |
| Electron injection layer | LiF layer (thickness: 0.3 nm) |
| Organic layer 63 | the same as described above |
| First electrode (anode) 61 | Al—Nd layer (thickness: 0.2 μm) |
| Interlayer insulating layer 41 | $SiO_2$ layer |
| TFT | forms a driving circuit |
| First substrate 40 | soda glass |

Figure 3A:
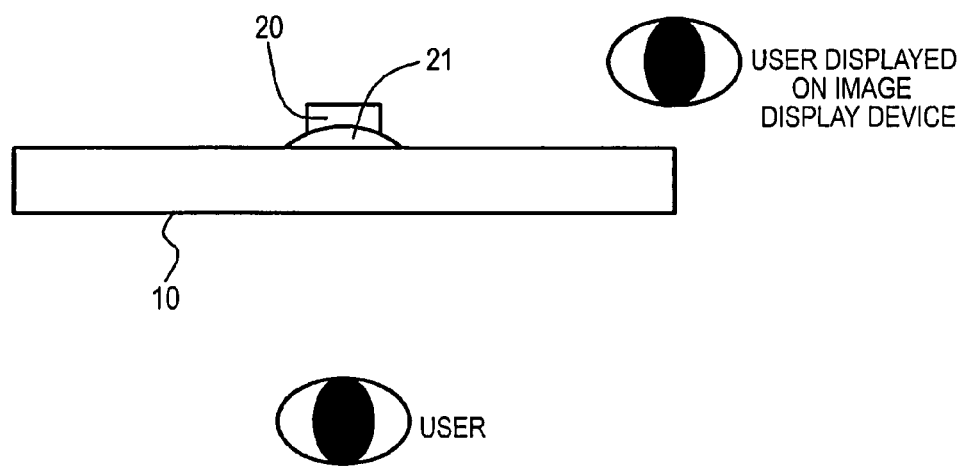
FIG. 3A is a conceptual view showing the image display device with an imaging unit.
Figure 3B:
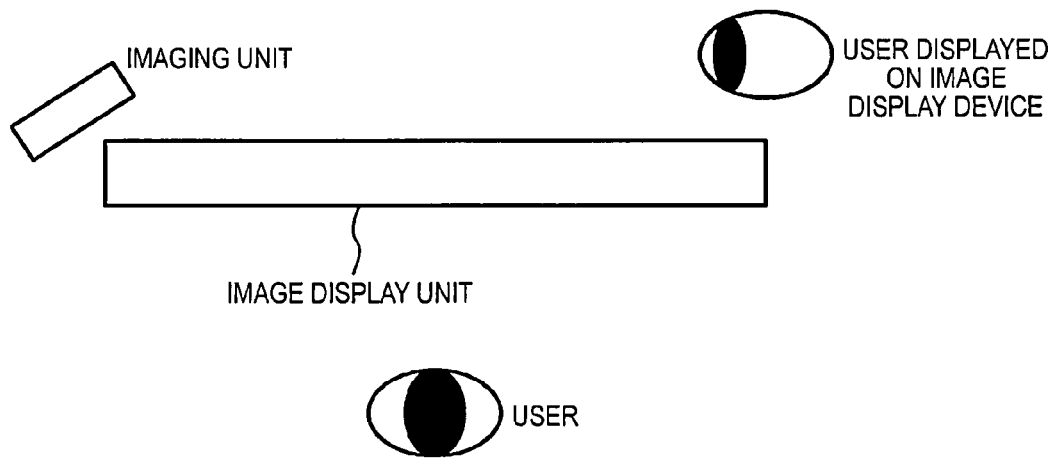
FIG. 3B is a conceptual view showing an image display device in which an imaging unit is fixed to the outer side of an image display unit.

FIG. 3A is a conceptual view showing the image display device with an imaging unit in the first example, and FIG. 3B is a conceptual view showing an image display device in which an imaging unit is fixed to the outer side of an image display unit. When an imaging unit is fixed to the outer side of the image display unit as shown in FIG. 3B, the imaging unit images a user of the image display device in an inclined state. Accordingly, when a resultant image is displayed on the image display unit, the image of the user imaged in the inclined state is displayed on the image display unit. Accordingly, it is difficult to display the user's face correctly, and also difficult to correctly determine which part of the image display unit the user is watching. Moreover, when the user approaches the image display unit, the user may be out of the imaging range. On the other hand, in the image display device with an imaging unit in the first example, the imaging unit is disposed in the middle portion at the rear side of the image display unit, as shown in FIG. 3A. In this case, since the imaging unit can image the user of the image display device with an imaging unit from the front side, an image of the user imaged from the front side is displayed on the image display unit when a resultant image is displayed on the image display unit. Accordingly, it is possible to display the user's face correctly. As a result, it is possible to easily and correctly determine which part of the image display unit the user is watching. In addition, it is possible to image the user even when the user approaches the image display unit.

Thus, in the image display device with an imaging unit in the first example, the light transmitted through the light transmissive section 30 (plurality of light transmissive sections 30) provided in each of the plurality of pixels 11 is condensed to the imaging unit 20. Accordingly, a highly precise and minute lens is not necessary in order to form an image on the imaging unit 20 correctly. As a result, a sufficient amount of light can be condensed to the imaging unit 20 without increasing the manufacturing costs of the image display device with an imaging unit. Moreover, since it is possible to specify a corresponding indication point of the image display unit from the direction of a hand, a pen, or the like, a so-called pointer function can be easily added to the image display device with an imaging unit. In addition to the pointer function, a motion of user's face, eyes, or hand, surrounding brightness, and the like can also be seen from an image obtained by imaging. Accordingly, it is possible to acquire various kinds of information from the image display device with an imaging unit since and to transmit the information to various systems. As a result, the value of the image display device with an imaging unit can be increased.

A second example is a modification of the first example, and is related to a first configuration of the present invention. In the second example, in order to obtain an image with much higher image quality, predetermined processing is performed on the image.

Figure 4:
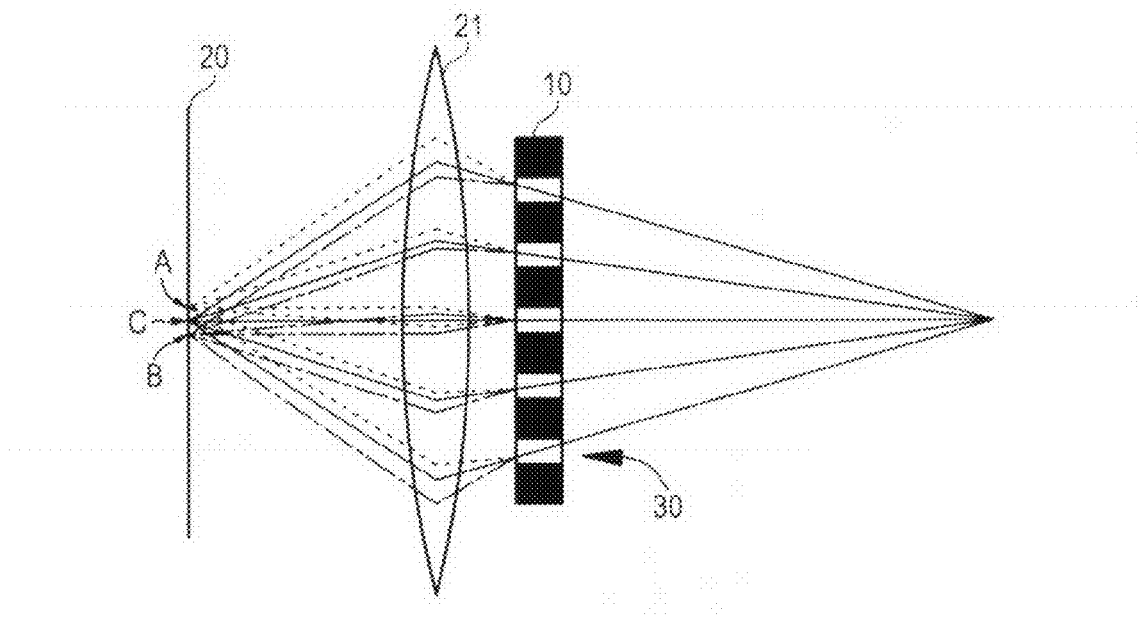
FIG. 4 is a schematic view illustrating a diffraction phenomenon caused by a slit.
Figure 5A:
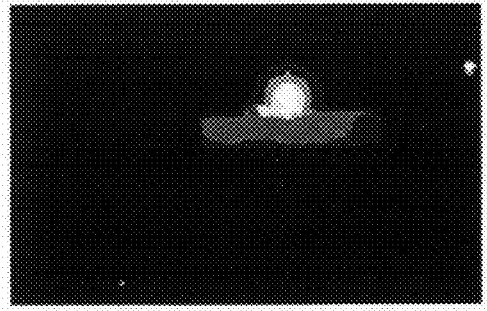
FIG. 5A shows an image obtained by imaging in a state where a transparent glass plate is disposed before an imaging unit.
Figure 5B:
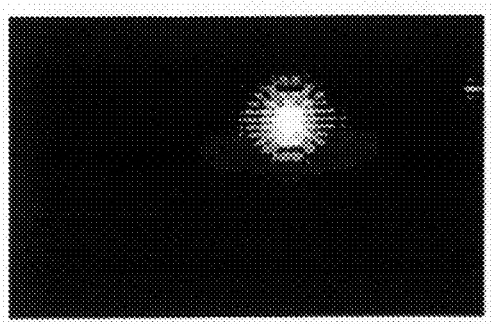
FIG. 5B shows an image obtained by imaging in a state where a transparent glass plate, in which light transmissive sections with predetermined shape, size, and distribution are provided, is disposed before an imaging unit.

Generally, when light passes through the minute light transmissive section 30, a so-called diffraction phenomenon occurs in the light transmissive section 30. FIG. 4 is a schematic view illustrating the diffraction phenomenon caused by a slit. Here, the light transmissive section 30 acts as a slit, and the same images as an image "C" appear as images "A" and "B" at equal pitches by the diffraction phenomenon. As a result, a blur is generated on the image. FIG. 5A shows an image obtained by imaging in a state where a transparent glass plate is disposed before the imaging unit 20. FIG. 5B shows an image obtained by imaging in a state where a transparent glass plate, in which light transmissive sections with predetermined shape, size, and distribution are provided, is disposed before the imaging unit 20. On the image shown in FIG. 5B, a blur is recognized. On the other hand, a blur is not recognized on the image shown in FIG. 5A. The intensity and distribution of diffracted light depends on the shape, size, and distribution of the light transmissive section 30 and the wavelength of incident light (outside light). When a blur caused by diffraction is small, it is not necessary to perform processing for correcting (compensating for) the diffraction on the image obtained by imaging. However, in order to acquire a high-quality image, it is necessary to correct (compensate for) an influence caused by the diffracted light.

The image display device with an imaging unit in the second example further includes a diffraction correcting unit 100 that corrects (compensates for) diffraction, which occurs in the light transmissive section 30, with respect to the image information acquired through the imaging unit 20.

The diffraction distribution $P_{diff}$ can be calculated from expression (1) if the pattern shape, size, and distribution of the light transmissive sections 30 and the wavelength of incident light (outside light) are determined. Moreover, in double integral, integration is performed from $-\infty$ to $+\infty$ with respect to x and y.

$$P_{diff}(k_x,k_y)=\iint P_{at}(x,y)\cdot\exp[-j(k_x\cdot x+k_y\cdot y)]dxdy \quad (1)$$

Here, $kx=(2\pi/\lambda)\sin(\theta_x)$, $ky=(2\pi/\lambda)\sin(\theta_y)$.

$P_{at}(x, y)$ is a two-dimensional pattern on the xy plane of the light transmissive section 30, $\lambda$ is a wavelength of incident light (outside light), and $\theta_x$ and $\theta_y$ are angles of diffraction in x and y directions, respectively. In the second example, the value of the wavelength $\lambda$ of incident light (outside light) is fixed as 525 nm in order to simplify the calculation.

Since expression (1) is two-dimensional Fourier transform of $P_{at}(x, y)$, it can be calculated at high speed by using fast Fourier transform (hereinafter, abbreviated to "FFT"). In addition, $P_{diff}(k_x, k_y)$ includes the phase information. In practice, however, the diffracted light intensity $H_{diff}(k_x, k_y)$ is detected. The diffracted light intensity $H_{diff}(k_x, k_y)$ is equal to the square of the absolute value of $P_{diff}(k_x, k_y)$.

$$H_{diff}(k_x,k_y)=|P_{diff}(k_x,k_y)|^2 \quad (2)$$

Here, since the space resolution of the imaging unit is modulated by diffracted light, an MTF (Modulation Transfer Function) is calculated from the following expression (3). In addition, "FFT[ ]" means executing fast Fourier transform, and "IFFT[ ]" means executing a fast inverse Fourier transform.

$$MTF(f_x,f_y)=|FFT[H_{diff}(k_x,k_y)]|^2 \quad (3)$$

Here, $f_x$ and $f_y$ indicate spatial frequencies in the x and y directions in each imaging device which forms the imaging unit. In addition, the following relationship is satisfied between an image $I_{cam(x, y)}$ transmitted through the light transmissive section 30 on the imaging unit 20 and an original image $I_{ral(x, y)}$ assuming that the image is not transmitted through the light transmissive section 30.

$$FFT[I_{cam(x,y)}]=FFT[I_{ral(x,y)}]\times MTF(f_x,f_y) \quad (4)$$

That is, in a spatial frequency region, the image $I_{cam(x, y)}$ is a product of the original images $I_{ral(x, y)}$ and MTF. Accordingly, in order to obtain the original image $I_{ral(x,y)}$ from the image $I_{cam(x, y)}$, it is preferable to perform processing based on the following expression (5). In other words, it is preferable to perform inverse MTF transform, which is a calculation processing based on the shape, size, and distribution of the light transmissive sections 30 and the wavelength of incident light (outside light), on the image information.

$$I_{ral(x,y)}=IFFT[FFT[I_{cam(x,y)}]/MTF(f_x,f_y)] \quad (5)$$

Here, the MTF can be easily calculated since the two-dimensional pattern of the light transmissive section 30 after Fourier transform may be scaled by the wavelength of incident light (outside light) if the size, shape, and distribution of the light transmissive section 30 are determined. As a result, the original image can be easily restored from the relationship shown in the expression (5).

Figure 6:
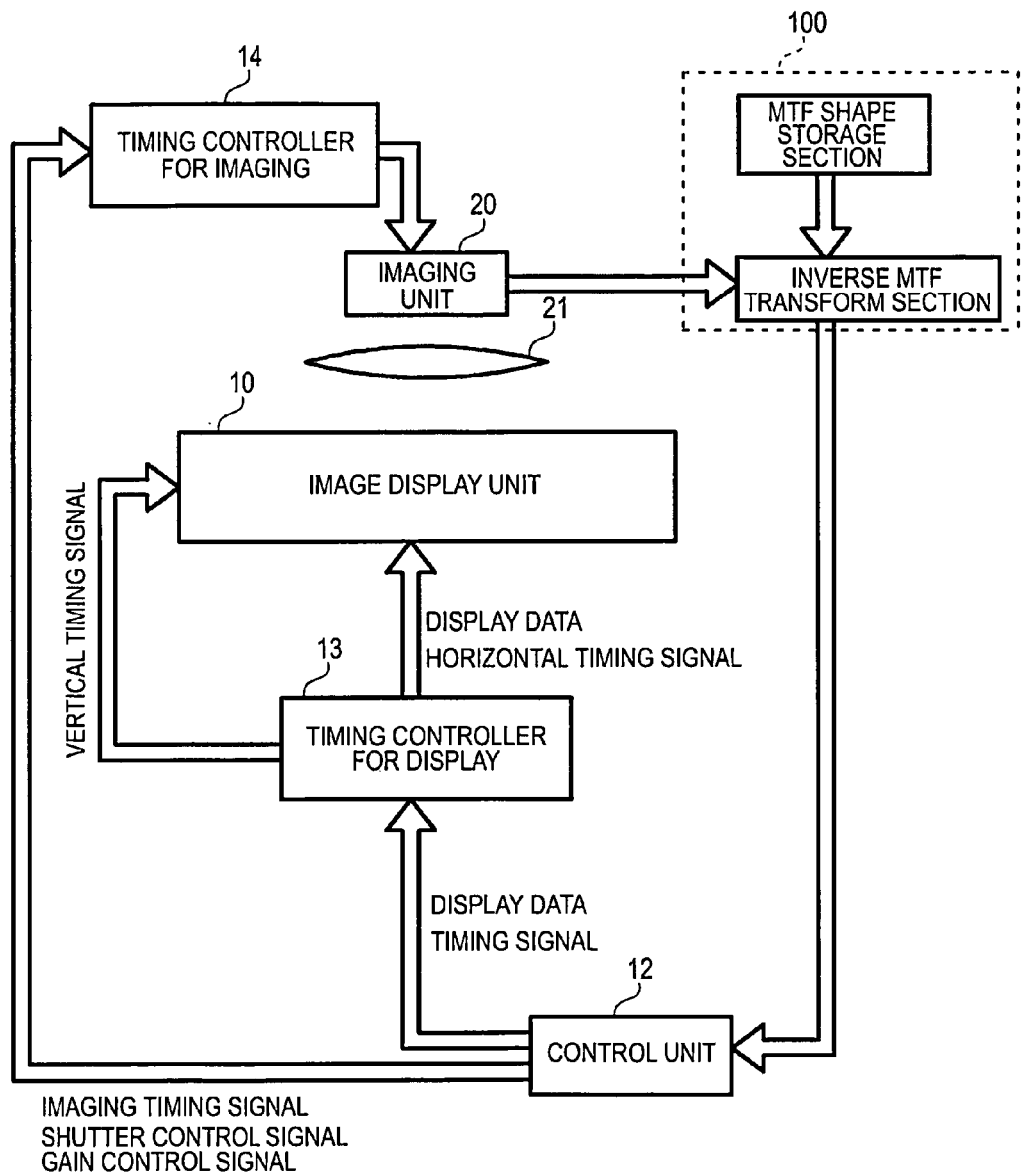
FIG. 6 is a block diagram showing an example of an image display device with an imaging unit.

FIG. 6 is a block diagram showing the image display device with an imaging unit in the second example. The image information acquired through the imaging unit 20 is transmitted to an inverse MTF transform section which forms the diffraction correcting unit 100. The inverse MTF transform section restores the image information to the original image by performing inverse MTF transform using the wavelength (in the second example, one kind of wavelength described above in order to simplify calculation) of outside light for each of red (R), green (G), and blue (B) and the MTF shape data of the light transmissive section 30, which is obtained by two-dimensional FFT, and transmits it to a control unit 12. The control unit 12 performs various kinds of detection, such as detection of a user's face or detection of an operation of a user's hand, from the restored image and reflects it on the image display unit. The MTF shape data, such as the size, shape, and distribution of the light transmissive section 30, is stored in an MTF shape storage section which forms the diffraction correcting unit 100. The control unit 12 is provided in the image display device with an imaging unit (or the image display unit), or is formed by a personal computer provided in the image display device with an imaging unit. The diffraction correcting unit 100 is also provided in the image display device with an imaging unit (or the image display unit), or is formed by a personal computer provided in the image display device with an imaging unit.

Image display in the image display unit 10 is performed by control of the control unit 12. That is, display data, a timing signal, and the like are transmitted from the control unit 12 to a timing controller 13 for display. The display data and a horizontal timing signal are transmitted from the timing controller 13 for display to a signal line control circuit (not shown), and a vertical timing signal is transmitted from the timing controller 13 for display to a scanning line control circuit (not shown). In the image display unit 10, the image display is performed on the basis of a known method. On the other hand, an imaging timing signal, a shutter control signal, a gain control signal, and the like are transmitted from the control unit 12 to a timing controller 14 for imaging. These signals are transmitted from the timing controller 14 for imaging to the imaging unit 20, so that the operation of the imaging unit 20 is controlled.

An image processing unit thus comprises the controller 12, which drives a display area of a display unit, the display area including a plurality of pixels and a plurality of light transmissive sections at locations within the display area corresponding to the plurality of pixels, the plurality of light transmissive sections configured to separately receive light incident upon the image display unit, and pass the received light to an imaging unit; and a correction unit 100 that performs a correction on image information for an image captured by the imaging unit using light received through the plurality of light transmissive elements.

FIG. 6 and the related description similarly describe an example of an image processing method that comprises driving a display area of a display unit, the display area including a plurality of pixels and a plurality of light transmissive sections at locations within the display area corresponding to the plurality of pixels, the plurality of light transmissive sections configured to separately receive light incident upon the image display unit, and pass the received light to an imaging unit; and correcting image information for an image captured by the imaging unit using light received through the plurality of light transmissive elements.

Figure 7A:
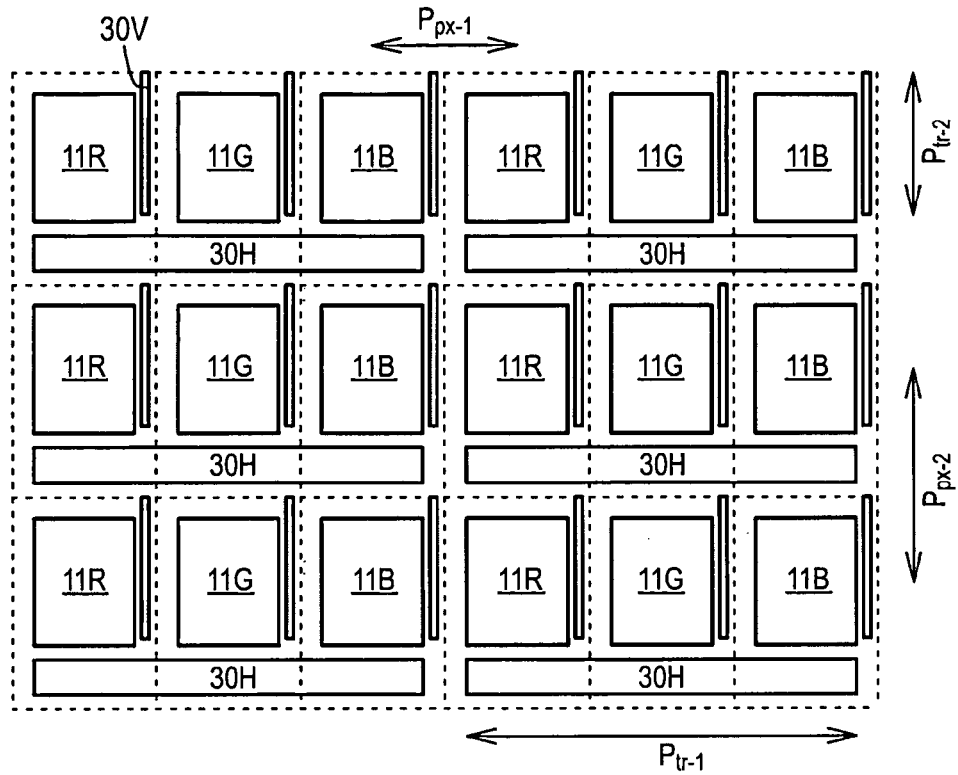
FIGS. 7A and 7B are schematic views showing a shape of a light transmissive section.
Figure 7B:
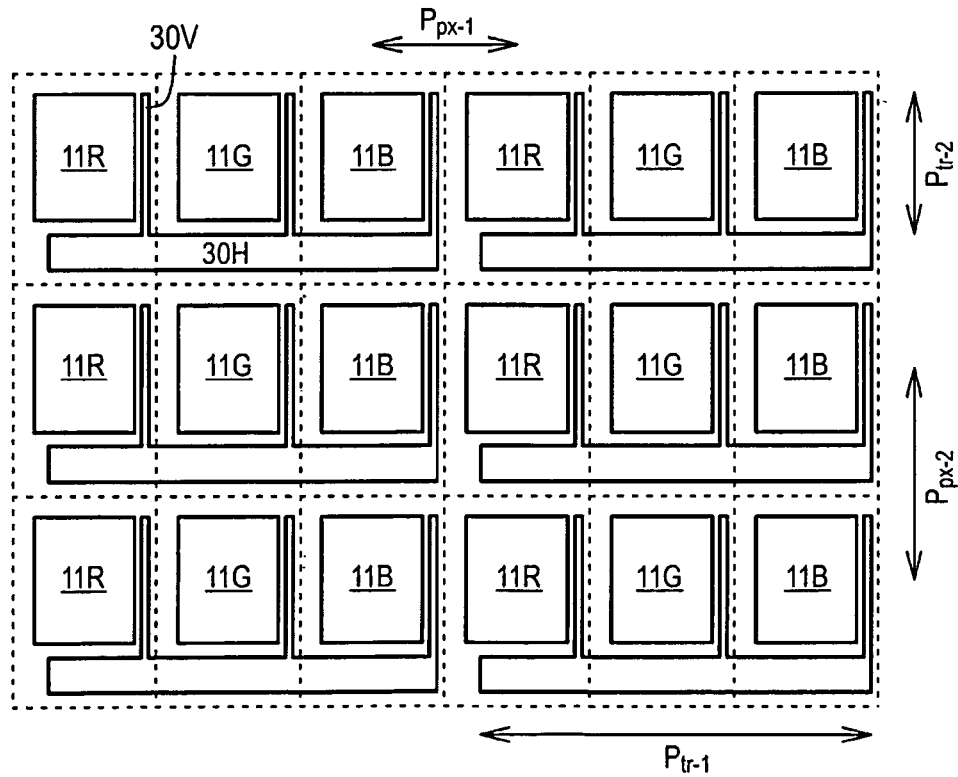
Figure 8:
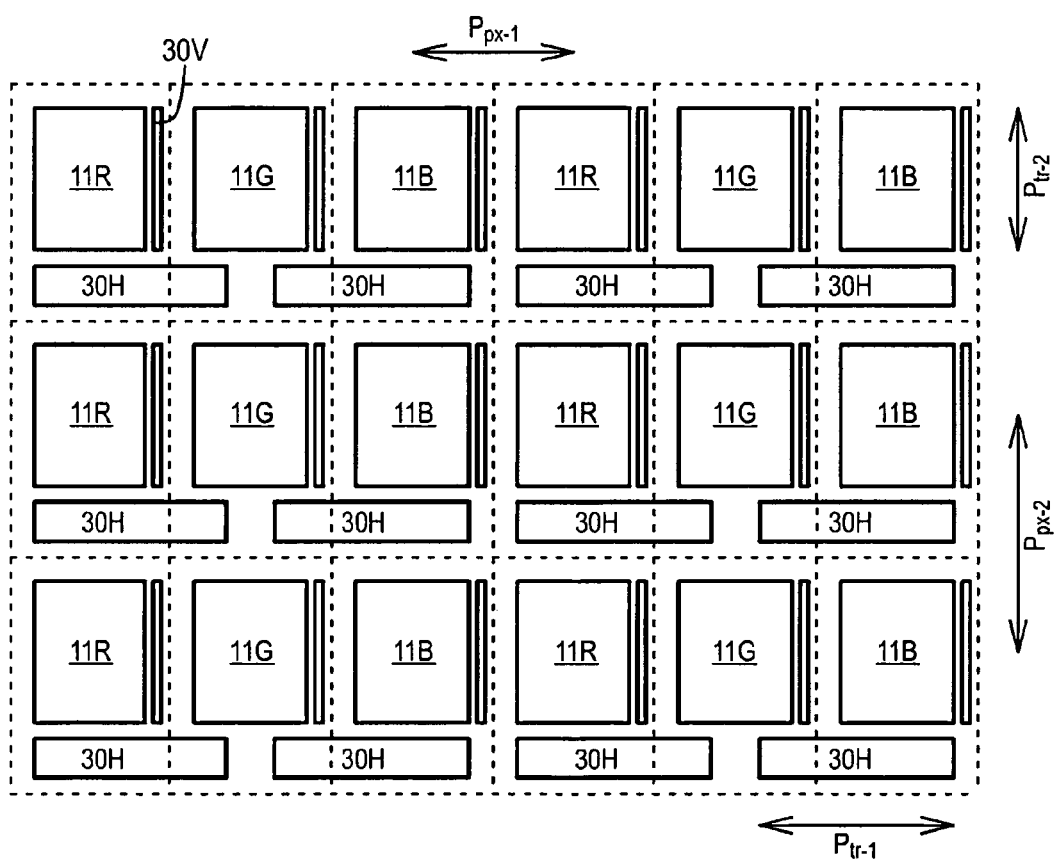
FIG. 8 is a schematic view showing another shape of the light transmissive section.

FIGS. 7A, 7B, and 8 are views showing examples of the shape of the light transmissive section 30. Some or all of the light transmissive sections 30 are provided periodically along the first direction (horizontal direction) and the second direction (vertical direction) of an image display unit. In the example shown in FIG. 7A, a light transmissive section 30H which extends along the first direction (horizontal direction) below pixels is provided over one pixel unit configured to include three pixels 11R, 11G, and 11B, and a light transmissive section 30V which extends along the second direction (vertical direction) is provided in the pixels 11R, 11G, and 11B and is also provided between pixels. In the example shown in FIG. 7B, the light transmissive section 30H and the light transmissive section 30 are connected to each other. In the example shown in FIG. 8, the light transmissive section 30H is provided over one pixel unit configured to include the three pixels 11R, 11G, and 11B, but is formed of two parts unlike that shown in FIG. 7A. Assuming that the length of the light transmissive section 30 in the first direction is $L_{tr-1}$ and the pitch between the pixels 11 in the first direction is $P_{px-1}$, the line aperture ratio $L_{tr-1}/P_{px-1}$ in the first direction satisfies $L_{tr-1}/P_{px-1} \geqq 0.5$. Assuming that the length of the light transmissive section 30 in the second direction is $L_{tr-2}$ and the pitch between the pixels 11 in the second direction is $P_{px-2}$, the line aperture ratio $L_{tr-2}/P_{px-2}$ in the second direction satisfies $L_{tr-2}/P_{px-2} \geqq 0.5$. This can be explained from the definition of MTF.

As shown in the following expression (6) derived from expressions (2) and (3), the MTF is obtained by performing fast Fourier transform of the square of the diffraction distribution, which is acquired from a two-dimensional pattern $P_{at}(x, y)$ of the light transmissive section 30 on the xy plane, and then calculating the square of the result again.

$$MTF(f_x, f_y) = |FFT[|P_{diff}(k_x, k_y)|^2]|^2 \tag{6}$$

Moreover, from the so-called Wiener-Khintchin theorem, the Fourier transform of an autocorrelation function is equal to the power spectrum. Accordingly, the MTF is equal to the square of the absolute value of the autocorrelation function of the distribution of diffraction occurring in the light transmissive section 30. The condition of the autocorrelation function in which there is no point (that is, point at which the MTF becomes 0), which is so-called uncorrelated in a spatial frequency region, is $L_{tr-1}/P_{px-1} \geqq 0.5$ and $L_{tr-2}/P_{px-2} \geqq 0.5$. When there is no point at which the MTF becomes 0, expression (5) does not have a singular point. Accordingly, it becomes easy to restore the original image. Therefore, it is preferable that the value of the line aperture ratio $L_{tr-1}/P_{px-1}$ in the first direction and the value of the line aperture ratio $L_{tr-2}/P_{px-2}$ in the second direction are equal to or larger than 0.5.

A third example is a modification of the second example, and is related to a second configuration of the present invention. As described in the second example, the wavelength λ of incident light (outside light) is included in expression (1) for calculating the diffraction distribution $P_{diff}(k_x, k_y)$ on the xy plane of the light transmissive section 30. Therefore, since it is possible to adapt an MTF of each wavelength according to an external environment by measuring the wavelength distribution of outside light, diffraction can be corrected and compensated for more correctly. As a result, it is possible to obtain an image with a much higher image quality.

FIG. 9 is a block diagram showing an image display device with an imaging unit in the third example. In the third example 3, a wavelength distribution measuring unit 110 which measures the wavelength distribution of outside light is further provided. Specifically, the wavelength distribution measuring unit 110 is configured to include a set of a photosensor attached with a red filter, a photosensor attached with a green filter, and a photosensor attached with a blue filter. By providing such a wavelength distribution measuring unit 110, the wavelength distribution (spectrum of light) of the outside light can be acquired. Moreover, the wavelength distribution of each of the primary colors (red, green, blue) of an image obtained by imaging can be acquired by multiplying the wavelength distribution of the outside light by the spectrum of the imaging unit. Moreover, diffraction can be corrected and compensated for more correctly by weighting an image, which is obtained by performing inverse MTF transform for every wavelength, with the wavelength distribution of the image obtained by imaging.

In the third example, not only can diffraction be corrected and compensated for more correctly, but also the precision of the image information acquired through the imaging unit 20 can be improved (for example, precision of the color information can be improved) by adopting such a configuration. When a blur caused by diffraction is small, it is not necessary to perform processing for correcting (compensating for) the diffraction on the image obtained by imaging. Also in this case, however, the precision of the image information acquired through the imaging unit 20 can be improved by further providing the wavelength distribution measuring unit 110 that measures the wavelength distribution of outside light.

A fourth example is also a modification of the first to third examples, and is related to a third configuration of the present invention. An image display device with an imaging unit in a fourth example further includes an information transmitting unit (not shown), which transmits the image information acquired through the imaging unit 20, and a display unit (not shown), which displays an image based on the image information input from the outside on the image display unit 10. In addition, the image information acquired through the imaging unit 20 is transmitted to the outside by the information transmitting unit, and the image based on the image information input from the outside is displayed on the image display unit 10 by the display unit.

In this case, an existing means used in a video conference system (TV phone system) is preferably used as the information transmitting unit that transmits the image information acquired through the imaging unit 20 and the display unit that displays an image based on the image information input from the outside on the image display unit 10. In addition, the information transmitting unit and the display unit are included in the control unit 12, for example.

A so-called video conference system (TV phone system) may be built by connecting a plurality of such image display devices with imaging units through a communication line, a network, or the like. In addition, since the imaging unit is disposed at the rear side of the image display unit, a user's face located at the front of the image display unit can be imaged. Accordingly, since a user's face at the other side projected on the image display unit faces a user at one side, there is no sense of discomfort caused when their eyes are not met in a known TV phone system.

A fifth example is a modification of the first to third examples, and is related to a fourth configuration of the present invention. An image display device with an imaging unit in a fifth example further includes a storage unit (not shown), which stores the image information acquired through the imaging unit 20, and a display unit (not shown) that displays images, which are based on the image information acquired through the imaging unit 20 (image information acquired already may also be included) and the image information stored in the storage unit, on the image display unit 10. In addition, the display unit displays the image based on the image information acquired through the imaging unit 20 (image information acquired already may also be included) on the image display unit 10 and also displays the image based on the image information, which is stored in the storage unit, on the image display unit 10. In addition, the storage unit and the display unit are included in the control unit 12, for example.

For example, the storage unit that stores the image information acquired through the imaging unit 20 may be formed by a known nonvolatile memory or hard disk drive provided in the imaging unit 20, the image display unit 10, or the control unit 12 and a known image information processing circuit provided in the imaging unit 20, the image display unit 10, or the control unit 12. In addition, the display unit that displays an image on the image display unit 10 may be formed by a known image information display circuit provided in the imaging unit 20, the image display unit 10, or the control unit 12.

Such an image display device with an imaging unit functions as a so-called digital mirror. For example, a video image or an image of a user imaged in the past may be compared with a current video image or a current image of the user. That is, by calling a past user image, displaying the past user image on the left side of the image display unit, and displaying the current user image on the right side using a switch, a button, or a keyboard for operation, for example, a comparison result of the past and current users can be displayed in separate windows on the image display unit 10. Thus, since past and current users can be compared with each other and the user can recognize the difference, the image display device with an imaging unit in the fifth example can be used for makeup, for example, makeup checking or face checking.

Figure 10A:
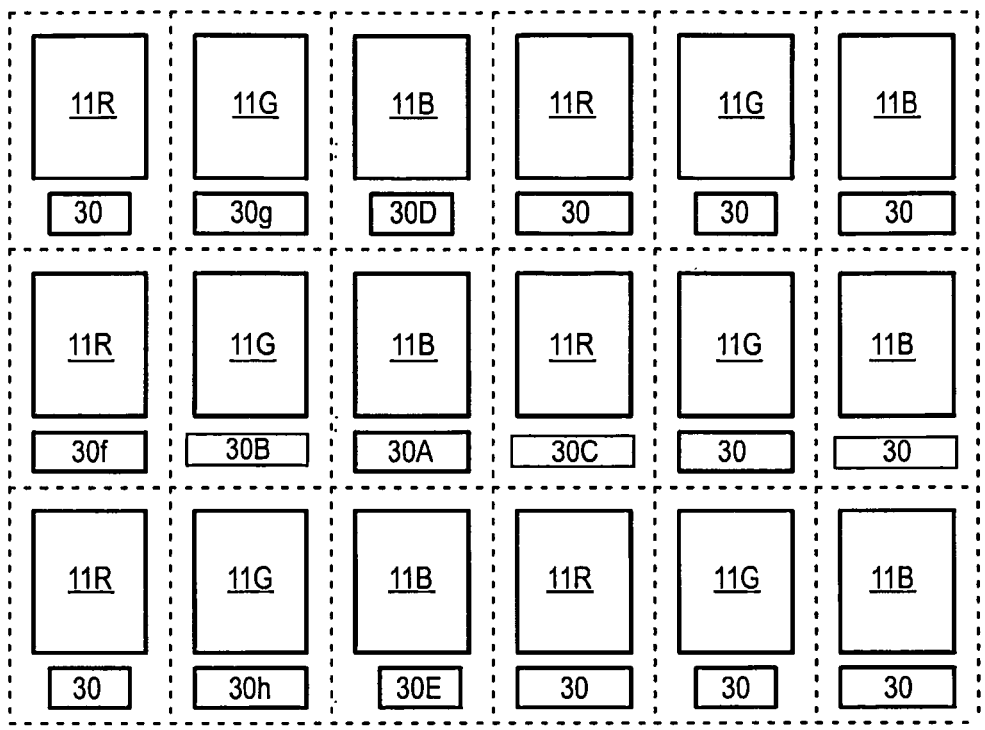
FIGS. 10A and 10B are schematic views showing an arrangement of a plurality of pixels which form an image display unit in an image display device with an imaging unit.

A sixth example is a modification of the first to fifth examples. As described above, when the light transmissive section 30 is minute, a diffraction phenomenon occurs in the light transmissive section 30. As a result, a blur may be generated on an image which is formed in the imaging unit 20 or the image may not be clear. For this reason, in the sixth example, a plurality of light transmissive sections are made to have random sizes. Specifically, as schematically shown in FIG. 10A, the sizes of at least two light transmissive sections adjacent to one light transmissive section are set differently from the size of the one light transmissive section. More specifically, the light transmissive section 30 is provided at forty places, and the sizes of four light transmissive sections adjacent to one light transmissive section are set differently from the size of the one light transmissive section for all light transmissive sections. In FIG. 10A, taking note of a light transmissive section 30A, two light transmissive sections 30B and 30C, which are adjacent to the light transmissive section 30A and are disposed in a horizontal direction, and two light transmissive sections 30D and 30E, which are adjacent to the light transmissive section 30A and are disposed in a vertical direction, are different in size from the light transmissive section 30A. In addition, taking note of the light transmissive section 30B, two light transmissive sections 30A and 30*f*, which are adjacent to the light transmissive section 30B and are disposed in the horizontal direction, and two light transmissive sections 30*g* and 30*h*, which are adjacent to the light transmissive section 30B and are disposed in the vertical direction, are different in size from the light transmissive section 30B. In this way, it was possible to avoid the diffraction phenomenon occurring in the light transmissive section 30. Moreover, in FIGS. 10A, 10B, and 11, in order to simplify the drawings, each of the four light transmissive sections 30 adjacent to one certain light transmissive section 30 is not shown so as to be different from the size of the one light transmissive section 30 for all of the light transmissive sections 30.

Figure 10B:
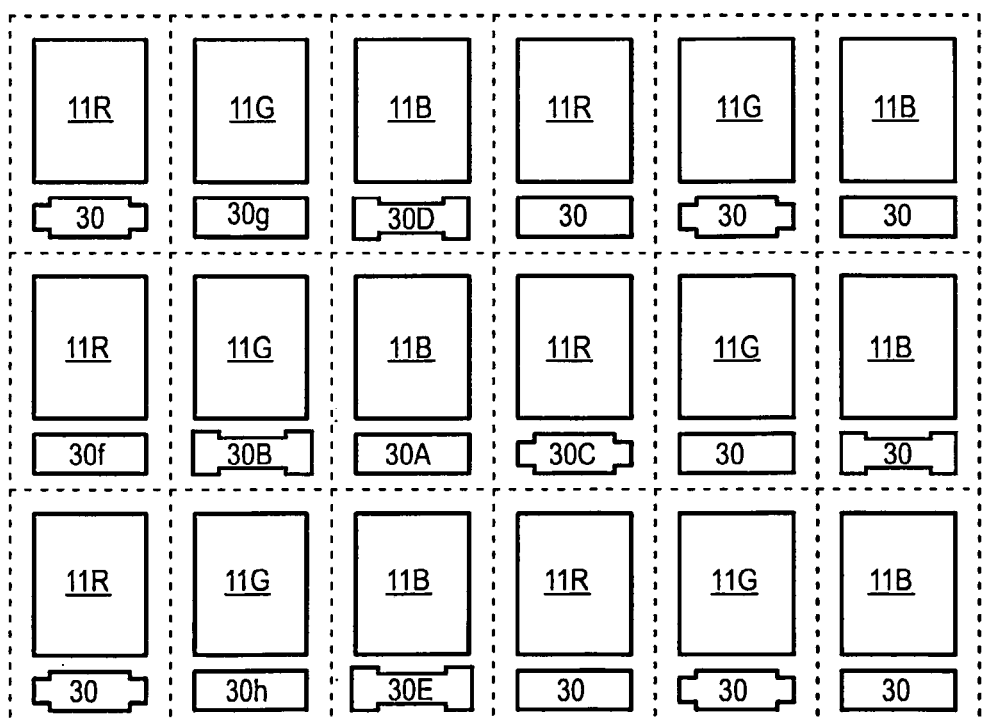

Alternatively, in the sixth example, the plurality of light transmissive sections is made to have random shapes. Specifically, as schematically shown in FIG. 10B, the shapes of at least two light transmissive sections adjacent to one light transmissive section are made differently from the shape of the one light transmissive section. More specifically, the light transmissive section 30 is provided at forty places, and the shapes of four light transmissive sections adjacent to one light transmissive section are made differently from the shape of the one light transmissive section for all light transmissive sections. In FIG. 10B, taking note of the light transmissive section 30A, two light transmissive sections 30B and 30C, which are adjacent to the light transmissive section 30A and are disposed in the horizontal direction, and two light transmissive sections 30D and 30E, which are adjacent to the light transmissive section 30A and are disposed in the vertical direction, are different in shape from the light transmissive section 30A. In addition, taking note of the light transmissive section 30B, two light transmissive sections 30A and 30f, which are adjacent to the light transmissive section 30B and are disposed in the horizontal direction, and two light transmissive sections 30g and 30h, which are adjacent to the light transmissive section 30B and are disposed in the vertical direction, are different in shape from the light transmissive section 30B. Also in this case, it was possible to avoid the diffraction phenomenon occurring in the light transmissive section 30.

Figure 11:
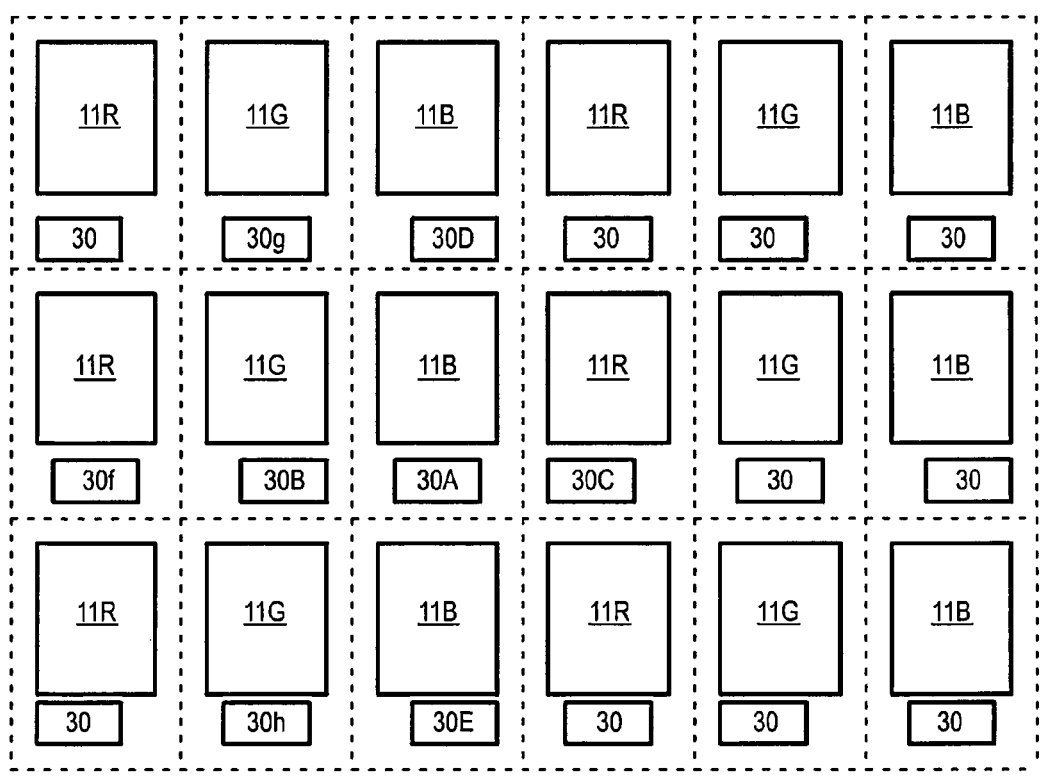
FIG. 11 is a schematic view showing an arrangement of a plurality of pixels which form the image display unit in the image display device with an imaging unit.

Alternatively, in the sixth example, the arrangement pitch between a plurality of light transmissive sections is randomly set. Specifically, as schematically shown in FIG. 11, the arrangement pitches between one light transmissive section and at least two light transmissive sections adjacent to the one light transmissive section are set differently. More specifically, the light transmissive section 30 is provided at forty places, and the arrangement pitches between four light transmissive sections, which are adjacent to one light transmissive section, and the one light transmissive section are differently set for all light transmissive sections. In FIG. 11, taking note of the light transmissive section 30A, the arrangement pitch between the light transmissive section 30A and each of the two light transmissive sections 30B and 30C, which are adjacent to the light transmissive section 30A and are disposed in the horizontal direction, and the arrangement pitch between the light transmissive section 30A and each of the two light transmissive sections 30D and 30E, which are adjacent to the light transmissive section 30A and are disposed in a vertical direction, are different. Also in this case, it was possible to avoid the diffraction phenomenon occurring in the light transmissive section 30.

In addition, it is preferable to process the opening 65A, which forms the light transmissive section 30, such that the configuration and structure described above can be acquired. Here, the minimum value of the size or the minimum shape of the light transmissive section 30 depends on the minimum processing dimension (for example, F: 0.5 μm) in a photolithographic technique or an etching technique for providing the light transmissive section 30. Therefore, the size of the light transmissive section 30 is defined by a group of units when a rectangular shape of an area $F^2$ (or a shape derived from the rectangular shape of the area $F^2$ by the photolithography technique) is set as one unit, and the shape of the light transmissive section 30 is also defined by the group of units.

In addition, the configuration and structure of the light transmissive section described in the sixth example may also be applied to the first to fifth examples.

Figure 12A:
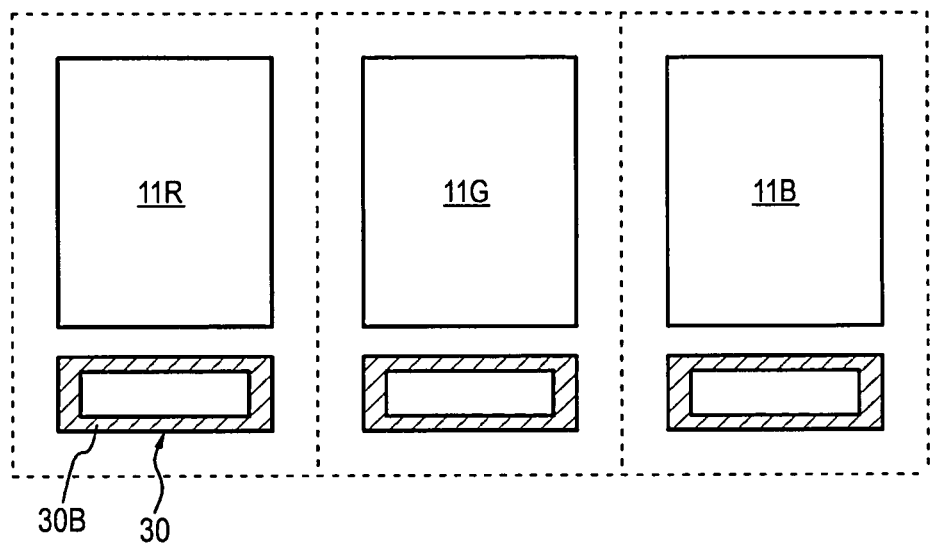
FIGS. 12A and 12B are schematic views showing an arrangement of a plurality of pixels which form an image display unit in an image display device with an imaging unit.
Figure 12B:
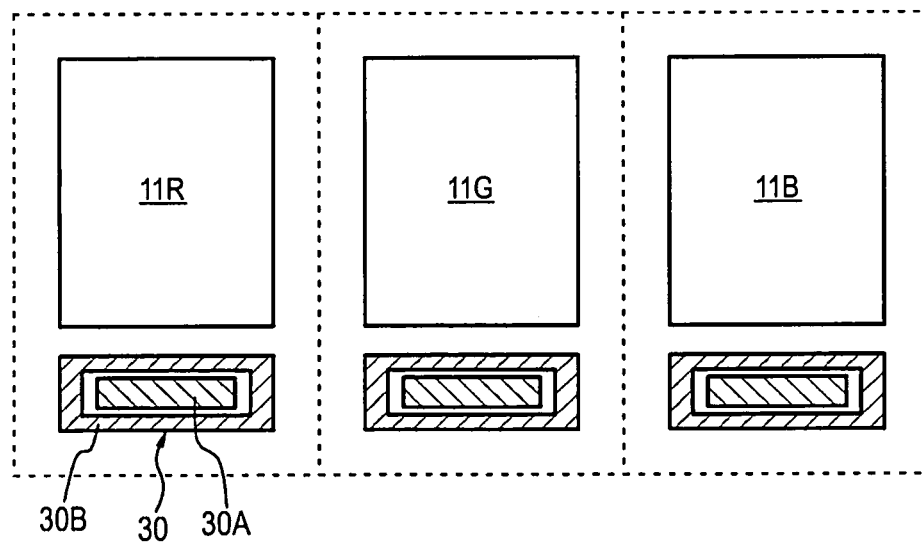

A seventh example is also a modification of the first to fifth examples. As described above, when the light transmissive section 30 is minute, a diffraction phenomenon occurs in the light transmissive section 30. As a result, a blur may be generated on an image which is formed in the imaging unit 20 or the image may not be clear. For this reason, in the seventh example, a light transmissive section is made to have a hollow structure or a double ring structure (double hollow structure). Specifically, FIGS. 12A and 12B schematically show the arrangement of a plurality of pixels which form an image display unit in an image display device with an imaging unit in the fifth example. The light transmissive section 30 is formed by the light transmissive section 30B (see FIG. 12A), or the light transmissive section 30 is formed by the first and second light transmissive sections 30A and 30B and the second light transmissive section 30B is disposed so as to surround the first light transmissive section 30A (see FIG. 12B).

Moreover, in FIGS. 12A and 12B, the light transmissive section 30B and the first and second light transmissive sections 30A and 30B are shown with oblique lines in order to clearly show the light transmissive section 30B and the first and second light transmissive sections 30A and 30B. It was possible to suppress the occurrence of the diffraction phenomenon reliably by optimizing the sizes, shapes, and arrangement state of the light transmissive section 30B and the first and second light transmissive sections 30A and 30B, the positional relationship of the light transmissive section 30B, and the positional relationship of the first and second light transmissive sections 30A and 30B. In addition, the configuration and structure of the light transmissive section in the seventh example may also be applied to the first to fifth examples. Moreover, from the point of view that the occurrence of a point, at which the MTF becomes 0, can be avoided as described in the second example, it is more preferable to make an opening have a hollow structure or a double ring structure. The reason is as follows. That is, assuming that an MTF corresponding to the rectangular opening shape at the outer side in the hollow structure or the double ring structure is $MTF_{out}(f_x, f_y)$ and an MTF corresponding to the rectangular opening shape at the inner side is $MTF_{in}(f_x, f_y)$, MTF $(f_x, f_y)$ as the entire opening with the hollow structure or the double ring structure is expressed as MTF $(f_x, f_y) = MTF_{out}(f_x, f_y) + MTF_{in}(f_x, f_y)$. Accordingly, a zero point of $MTF_{out}(f_x, f_y)$ can be negated by taking a sum with $MTF_{in}(f_x, f_y)$. By forming the shape of an opening as a hollow shape as described above, not only the occurrence of the diffraction phenomenon can be reduced but also the reproduction of an image based on correction and compensation for the diffraction phenomenon becomes easier. In addition, the sixth and seventh examples may be combined.

Figure 13A:
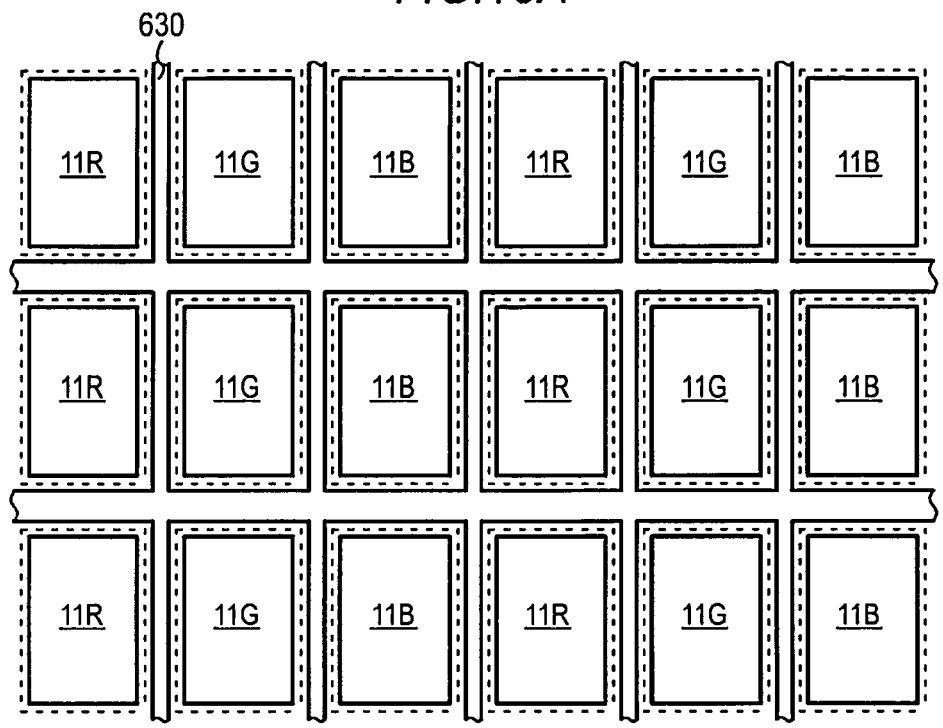
FIGS. 13A and 13B are schematic views showing a shape of a light transmissive section.
Figure 13B:
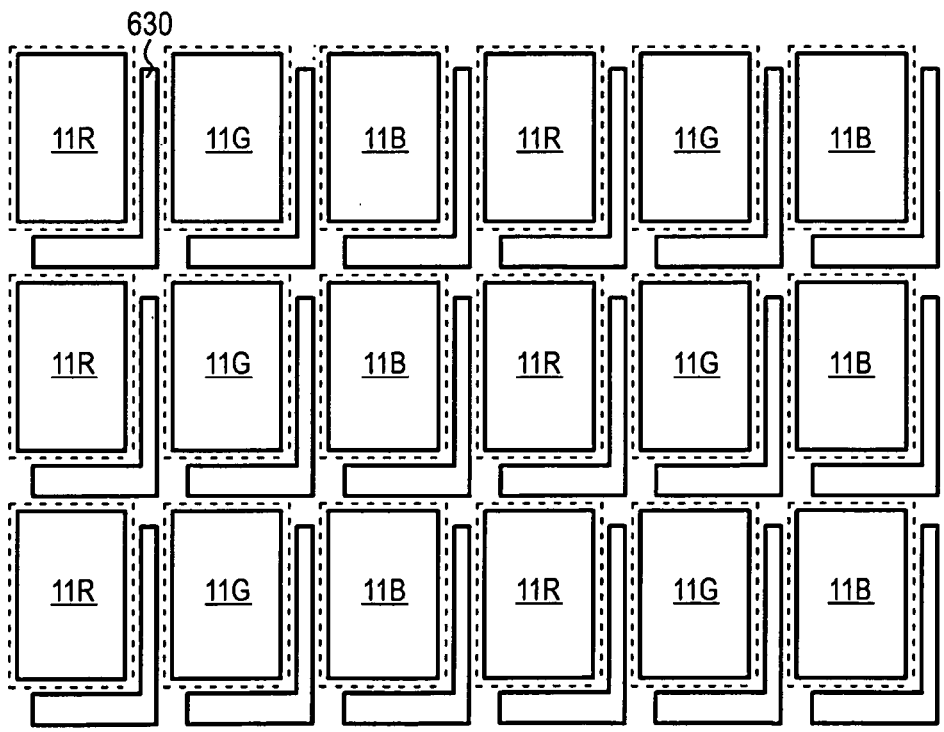

An eighth example is related to the image display device with an imaging unit according to the second embodiment of the present invention. FIGS. 13A and 13B schematically show the arrangement of a plurality of pixels 11 (11R, 11G, 11B) which form an image display unit in an image display device with an imaging unit in the eighth example. The image display device with an imaging unit in the eighth example includes: an image display unit 10 in which the plurality of pixels 11 including light emitting devices are arrayed; a light transmissive section 630 provided around at least one or more pixels 11; an imaging unit 20 disposed at the rear side of the image display unit 10; and a condensing unit 21 which condenses the light beams transmitted through the light transmissive section 630 to the imaging unit 20.

In the example shown in FIG. 13A the light transmissive section forms a contiguous pattern of light transmissive portions surrounding individual ones of the plurality of pixels. The light transmissive section is similarly configured to receive light incident upon the image display unit, and pass the received light to the imaging unit. Specifically, the light transmissive section 630 is provided around the entire pixel 11 and has a hanging rack shape. In addition, in the example shown in FIG. 13B, the light transmissive section 630 is provided around a part of the pixel 11 and has an "L" shape. In the image display device with an imaging unit in the eighth example, the light transmissive section 630 is provided around at least one or more pixels 11. Specifically, the light transmissive section 630 is provided around the eighteen (6×3=18) pixels 11.

Except for the points described above, the image display device with an imaging unit can be made to have the same configurations and structures as the image display devices with imaging units in the first to fifth examples. Accordingly, a detailed explanation thereof will be omitted.

Thus, in the image display device with an imaging unit in the eighth example, the light transmitted through the light transmissive section 630 provided around at least one or more pixels 11 is condensed to the imaging unit 20. Accordingly, a highly precise and minute lens is not necessary in order to form an image on the imaging unit 20 correctly. As a result, a sufficient amount of light can be condensed to the imaging unit 20 without increasing the manufacturing costs of the image display device with an imaging unit. Moreover, since it becomes possible to specify a corresponding indication point of the image display unit from the direction of a hand, a pen, or the like, a so-called pointer function can be easily added to the image display device with an imaging unit. In addition to the pointer function, a motion of user's face, eyes, or hand, surrounding brightness, and the like can be seen. Accordingly, it is possible to acquire various kinds of information from the image display device with an imaging unit and to transmit the information to various systems. As a result, the value of the image display device with an imaging unit can be increased.

Figure 14A:
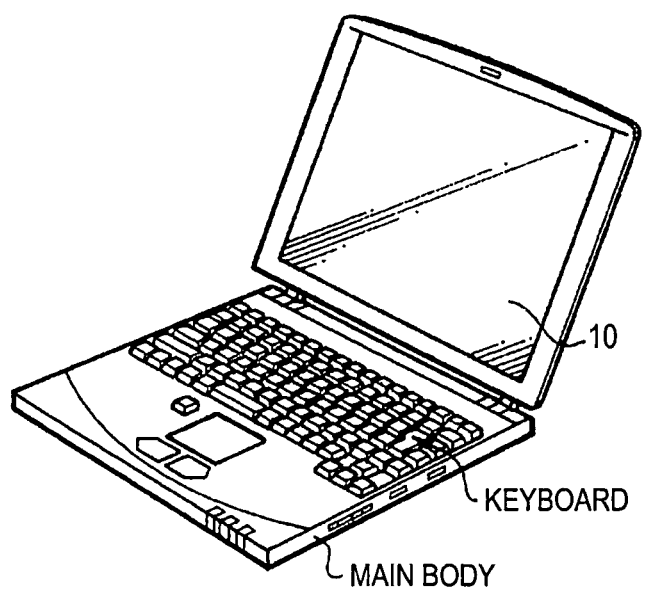
FIG. 14A is a schematic view showing a notebook type personal computer.
Figure 14B:
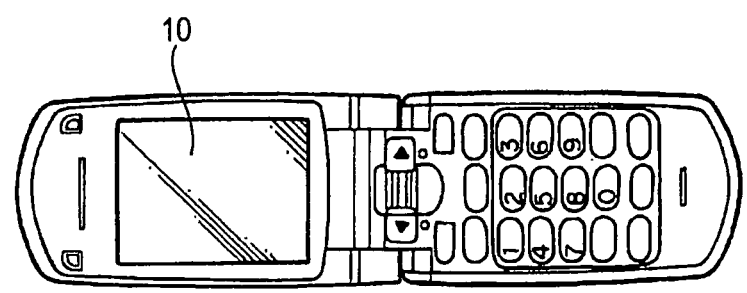
FIG. 14B is a schematic view showing a mobile phone.

While the present invention has been described through the preferred examples, the present invention is not limited to these examples. The configurations and structures of the image display devices with imaging units described in the above examples are for illustrative purposes and may be appropriately changed. The image display device with an imaging unit may be used as an alternative of a monitor device built in various electronic apparatus including but not limited to a notebook type personal computer (see FIG. 14A) a mobile phone (refer to FIG. 14B), a PDA, or a games console or as an alternative to a known television receiver.

Moreover, if two imaging units are disposed at the rear side of the image display unit, not only the face, eyes, movement, and the like of a user located at the front side of the image display unit can be correctly recognized but also the distance from the image display unit to the user can be correctly measured on the basis of the image information from each of the imaging units. Moreover, one pixel unit may be made to include four or more kinds of pixels. For example, one pixel unit may include not only the three kinds of pixels 11R, 11G, and 11B but also a pixel which emits white light in order to improve the brightness, a pixel which emits light with a complementary color in order to expand the color reproduction range, a pixel which emits yellow light in order to expand the color reproduction range, a pixel which emits yellow and cyan light in order to expand the color reproduction range, and the like.

The present application contains subject matters related to those disclosed in Japanese Priority Patent Applications JP 2009-251729, JP 2010-047157 and JP 2010-047158 filed in the Japan Patent Office on Nov. 2, 2009, Mar. 3, 2010 and Mar. 3, 2010, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display unit comprising:
a display area including a plurality of pixels;
an imaging unit disposed behind the display area on a rear side of the display area; and
wherein the display area includes a plurality of light transmissive sections located at locations within the display area, each of the locations corresponding to at least one of the plurality of pixels,
wherein the image display unit is configured such that at least a portion of light that is incident on a front side of the image display unit enters the plurality of light transmissive sections,
wherein the display area is configured such that at least a portion of the light that enters the plurality of light transmissive sections is transmitted through the display area to the rear side thereof, and
wherein at least a portion of the light that is transmitted through the display area to the rear side thereof via the light transmissive sections is made incident upon the imaging unit.

2. The image display unit of claim 1, wherein the pixels respectively include self light emitting elements.

3. The image display unit of claim 1, wherein the plurality of pixels are a subset of a total amount of pixels included in the display area.

4. The image display unit of claim 1, wherein the imaging unit is disposed at a position that corresponds to a middle portion of the display area, and the locations of the plurality of light transmissive sections are located at the middle portion of the display area.

5. The image display unit of claim 1,
wherein the plurality of light transmissive sections are arranged periodically along a first direction, with a separation between adjacent ones of the plurality of light transmissive sections in the first direction, and
wherein each of the plurality of transmissive sections has a length $L_1$ in the first direction.

6. The image display unit of claim 5,
wherein the plurality of pixels are disposed at a pitch $P_1$ in the first direction, and
wherein a line aperture ratio in the first direction comprises the length $L_1$ divided by the pitch $P_1$, and the line aperture ratio in the first direction is greater than or equal to 0.5.

7. The image display unit of claim 6, wherein the line aperture ratio in the first direction is greater than or equal to 0.8.

8. The image display unit of claim 5,
wherein the plurality of light transmissive sections are arranged periodically along a second direction, with a separation between adjacent ones of the plurality of light transmissive sections in the second direction, and
wherein of the plurality of each transmissive sections has a length $L_2$ in the second direction.

9. The image display unit of claim 8,
wherein the plurality of pixels are disposed at a pitch $P_2$ in the second direction, and
wherein a line aperture ratio in the second direction comprises the length $L_2$ divided by the pitch $P_2$, and the line aperture ratio in the second direction is greater than or equal to 0.5.

10. The image display unit of claim 9, wherein the line aperture ratio in the second direction is greater than or equal to 0.8.

11. The image display unit of claim 1, wherein the plurality of light transmissive sections are arranged according to a distribution within the display area, and each of the plurality of light transmissive sections has a shape and a size, and wherein the image display unit further comprises:
a storage area that stores information regarding the shape, size and distribution of the plurality of light receiving elements; and
a correction unit that performs a correction on image information for an image captured by the imaging unit using light received through the plurality of light transmissive elements, the correction being based upon a function of the shape, size and/or distribution of the plurality of light receiving elements.

12. The image display unit of claim 11, wherein the correction is a diffraction correction, and the function is an inverse modulation transfer function.

13. The image display unit of claim 12, further comprising:
a wavelength distribution measurement unit that measures a wavelength distribution of ambient light of the image display unit, the wavelength distribution being provided to the correction unit for an ambient light wavelength distribution based correction of the image information.

14. The image display unit of claim 1, further comprising:
a correction unit that performs a correction on image information for an image captured by the imaging unit using light received through the plurality of light transmissive elements; and
a wavelength distribution measurement unit that measures a wavelength distribution of ambient light of the image display unit, the wavelength distribution being provided to the correction unit for an ambient light wavelength distribution based correction of the image information.

15. The image display unit of claim 1, wherein an image captured by the imaging unit using light received through the plurality of light transmissive sections is displayed on the display area.

16. The image display unit of claim 1, further comprising:
a memory that stores an image captured by the imaging unit using light received through the plurality of light transmissive sections, wherein the image stored in the memory is displayed on the display area, concurrently with another image captured by the imaging unit using light received through the plurality of light transmissive sections.

17. The image display unit of claim 1, further comprising:
a condensing unit, located between the display area and the imaging unit, which receives at least a portion of the light that is transmitted through the display area to the rear side thereof via the light transmissive sections, and condenses the received light for passage to the imaging unit.

18. The image display unit according to claim 1, wherein individual ones of the locations of the plurality of light transmissive sections respectively correspond to multiple pixels of the plurality of pixels.

19. An electronic apparatus comprising:
the display unit of claim 1.

20. An image processing unit comprising:
a controller for driving a display area of a display unit, the display area including a plurality of pixels and a plurality of light transmissive sections at locations within the display area corresponding to the plurality of pixels, the plurality of light transmissive sections configured to separately receive light incident upon the image display unit, and pass the received light to an imaging unit; and
a correction unit that performs a correction on image information for an image captured by the imaging unit using light received through the plurality of light transmissive elements.

21. An image processing method comprising:
driving a display area of a display unit, the display area including a plurality of pixels and a plurality of light transmissive sections at locations within the display area corresponding to the plurality of pixels, the plurality of light transmissive sections configured to separately receive light incident upon the image display unit, and pass the received light to an imaging unit; and
correcting image information for an image captured by the imaging unit using light received through the plurality of light transmissive elements.

22. The image processing method of claim 21, wherein the pixels respectively include self light emitting elements.

23. The image processing method of claim 21, wherein the plurality of pixels are a subset of a total amount of pixels included for the display area.

24. The image processing method of claim 21, wherein the imaging unit is disposed in a middle portion of the display area at the rear side of the image display unit, and the plurality of light transmissive sections are located at the middle portion of the display area.

25. The image processing method of claim 21, wherein the plurality of light transmissive sections are arranged periodically along a first direction, with a separation between adjacent light transmissive sections in the first direction, and each transmissive section having a length in the first direction.

26. The image processing method of claim 25, wherein a line aperture ratio comprises the length divided by the separation of the light transmissive sections, and the line aperture ratio in the first direction is greater than or equal to 0.5.

27. The image processing method of claim 26, wherein the line aperture ratio in the first direction is greater than or equal to 0.8.

28. The image processing method of claim 21, wherein the plurality of light transmissive sections are arranged according to a distribution within the display area, and each of the plurality of light transmissive sections has a shape and a size, and wherein the image processing method comprises:
storing information regarding the shape, size and distribution of the plurality of light receiving elements; and
performing a correction on image information for an image captured by the imaging unit using light received through the plurality of light transmissive elements, the correction being based upon a function of the shape, size and/or distribution of the plurality of light receiving elements.

29. The image processing method of claim 28, wherein the correction is a diffraction correction, and the function is an inverse modulation transfer function.

30. The image processing method of claim 29, wherein performing the correction further comprises an ambient light wavelength distribution based correction of the image information.

31. The image processing method according to claim 21, wherein individual ones of the plurality of light transmissive sections respectively correspond to multiple pixels of the plurality of pixels.

32. An integrated circuit that provides a display area of a display unit, the integrated circuit comprising:
a substrate;
a plurality of light emitting layers, each provided on a top side of the substrate and resident between a first electrode and a second electrode, each light emitting layer, first electrode and second electrode forming a light emitting element within a pixel area;
a protective layer disposed over the plurality of light emitting elements; and
a light shielding layer including a plurality of openings to form light transmissive sections corresponding to the pixel areas of the light emitting elements
wherein the integrated circuit is configured such that at least a portion of light that enters the plurality of light transmissive sections from a to side is transmitted through the integrated circuit to a rear side thereof.

33. An image display unit comprising:

a display area including a plurality of pixels;

an imaging unit disposed at a rear side of the image display unit behind the display area; and a light transmissive section forming a contiguous pattern of light transmissive portions surrounding individual ones of the plurality of pixels, the light transmissive section being configured to receive light incident upon the image display unit, and pass the received light to the imaging unit.

* * * * *